(12) United States Patent
Cheng

(10) Patent No.: US 12,170,246 B2
(45) Date of Patent: Dec. 17, 2024

(54) SEMICONDUCTOR DEVICE WITH CONTACT STRUCTURE

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/362,739

(22) Filed: Jul. 31, 2023

(65) Prior Publication Data

US 2023/0378057 A1 Nov. 23, 2023

Related U.S. Application Data

(62) Division of application No. 17/193,807, filed on Mar. 5, 2021, now Pat. No. 11,776,900.

(Continued)

(51) Int. Cl.
*H01L 23/522* (2006.01)
*H01L 21/48* (2006.01)
(Continued)

(52) U.S. Cl.
CPC ........ *H01L 23/5226* (2013.01); *H01L 21/486* (2013.01); *H01L 21/76802* (2013.01); *H01L 21/76841* (2013.01); *H01L 23/53266* (2013.01)

(58) Field of Classification Search
CPC ............... H01L 23/5226; H01L 21/486; H01L 21/76802; H01L 21/76841; H01L 23/53266; H01L 21/32135; H01L 21/76805; H01L 21/76832; H01L 21/76834; H01L 21/76849; H01L 23/485; H01L 23/53209; H01L 23/53242; H01L 23/53295; H01L 21/28518; H01L 21/76855; H01L 21/76856; H01L 21/76865; H01L 21/76846; H01L 27/088;
(Continued)

(56) References Cited

U.S. PATENT DOCUMENTS 6,277,739 B1 8/2001 Tseng
6,333,261 B1 12/2001 Lin et al.
(Continued)

FOREIGN PATENT DOCUMENTS

CN 110176443 A 8/2019
KR 20000073360 A 12/2000
(Continued)

*Primary Examiner* — Karen Kusumakar
(74) *Attorney, Agent, or Firm* — Seed IP Law Group LLP

(57) ABSTRACT

A semiconductor process system etches thin films on semiconductor wafers. The semiconductor process system includes a machine learning based analysis model. The analysis model dynamically selects process conditions for an etching process by receiving static process conditions and target thin-film data. The analysis model identifies dynamic process conditions data that, together with the static process conditions data, result in predicted remaining thin-film data that matches the target thin-film data. The process system then uses the static and dynamic process conditions data for the next etching process.

20 Claims, 19 Drawing Sheets

Related U.S. Application Data

(60) Provisional application No. 63/042,172, filed on Jun. 22, 2020.

(51) Int. Cl.
*H01L 21/768* (2006.01)
*H01L 23/532* (2006.01)

(58) Field of Classification Search
CPC ....... H01L 21/823475; H01L 21/76877; H01L 21/823412; H01L 29/78696; G06N 3/08; G06N 20/00
See application file for complete search history.

(56) References Cited

U.S. PATENT DOCUMENTS

| | | | |
|---|---|---|---|
| 8,531,033 B2 * | 9/2013 | Koike | ............... H01L 21/76855 438/653 |
| 2015/0028423 A1 | 1/2015 | Park et al. | |
| 2015/0061082 A1 | 3/2015 | Jan et al. | |
| 2016/0336270 A1 | 11/2016 | Chen et al. | |
| 2018/0261546 A1 | 9/2018 | Bark | |
| 2018/0301382 A1 | 10/2018 | Li | |
| 2021/0336038 A1 | 10/2021 | Zhang | |
| 2022/0173152 A1 | 6/2022 | Imamizu | |

FOREIGN PATENT DOCUMENTS

| | | | |
|---|---|---|---|
| KR | 20170141552 A | 12/2017 | |
| KR | 20190049796 A | 5/2019 | |
| KR | 20190099990 A | 8/2019 | |
| KR | 20200035896 A | 4/2020 | |
| TW | 201935649 A | 9/2019 | |
| TW | 202008483 A | 2/2020 | |
| WO | WO 2019212810 A1 | 11/2019 | |

* cited by examiner

SEMICONDUCTOR DEVICE WITH CONTACT STRUCTURE

BACKGROUND

Technical Field

The present disclosure relates to the field of semiconductor fabrication. The present disclosure relates more particularly to etching processes for semiconductor fabrication.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, these techniques also face serious difficulties in ensuring that the features are properly formed.

DETAILED DESCRIPTION

Figure 1A:
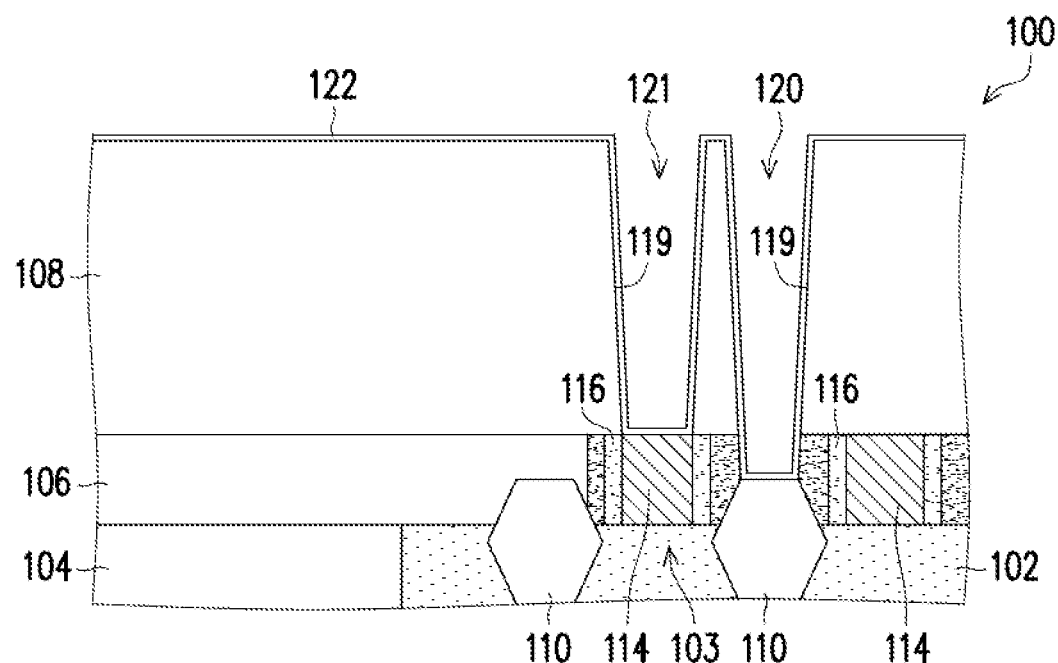
FIGS. 1A-1R are cross-sectional views of an integrated circuit at various stages of processing, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide thin films of reliable thickness and composition. Embodiments of the present disclosure utilize machine learning techniques to adjust thin-film etching process parameters between etching processes or even during etching processes. Embodiments of the present disclosure utilize machine learning techniques to train an analysis model to determine process parameters that should be implemented for a next thin-film etching process or even for a next phase of a current thin-film etching process. The result is that thin-film etching processes produce thin films having remaining thicknesses and compositions that reliably fall within target specifications. Integrated circuits that include the thin films will not have performance problems that can result if the thin films are not properly formed. Furthermore, batches of semiconductor wafers will have improved yields and fewer scrapped wafers.

FIG. 1A is a cross-sectional diagram of an integrated circuit 100, according to one embodiment. The integrated circuit 100 includes a semiconductor substrate 102. The semiconductor substrate 102 can include one or more of silicon, germanium, silicon germanium, gallium arsenide, silicon carbide, or other types of semiconductors. The semiconductor substrate 102 can include a monocrystalline semiconductor. The semiconductor substrate 102 can include multiple structures of different monocrystalline semiconductor materials. Other materials can be utilized for the semiconductor substrate 102 without departing from the scope of the present disclosure The semiconductor substrate 102 can include various doped regions. The doped regions can include N-wells, P-wells, source and drain regions, channel regions, antipunch through regions, and other types of doped regions. The doped regions can be formed with ion implantation processes, diffusion processes, or other types of doping processes. The dopant can include N-type dopants and P-type dopants. The various doped regions can be utilized to form transistors in conjunction with the semiconductor substrate 102.

In one embodiment, the semiconductor substrate 102 includes a plurality of semiconductor nanosheets or nanowires. The semiconductor nanosheets can be part of a gate all around transistor. Each of the nanosheets can be clad in one or more gate dielectric materials. The one or more gate dielectric materials can be covered in a metal gate material. In one example, the nanosheets include silicon or silicon germanium. The nanosheet can be formed from alternating layers of silicon and silicon germanium. Other types of materials and structures can be included in the semiconductor layer 102 without departing from the scope of the present disclosure.

The integrated circuit 100 includes a shallow trench isolation 104. The shallow trench isolation 104 can be utilized to separate groups of transistor structures formed in conjunction with the semiconductor substrate 102. The shallow trench isolation 104 can include a dielectric material. The dielectric material for the shallow trench isolation 104 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-enhanced CVD or flowable CND. Other materials and structures can be utilized for the shallow trench isolation 104 without departing from the scope of the present disclosure.

The integrated circuit 100 includes an interlayer dielectric layer 106 positioned on the shallow trench isolation 104 and the substrate 102. The interlayer dielectric layer 106 can include one or more of silicon oxide, silicon nitride, SiCOH, SiOC, or an organic polymer. Other types of dielectric materials can be utilized for the interlayer dielectric layer 106 without departing from the scope of the present disclosure.

The integrated circuit 100 includes an interlayer dielectric layer 108 positioned on the interlayer dielectric layer 106. The interlayer dielectric layer 108 can include one or more of silicon oxide, silicon nitride, SICOH, SiOC, or an organic polymer. Other types of dielectric materials can be utilized for the interlayer dielectric layer 108 without departing from the scope of the present disclosure.

The integrated circuit 100 includes metal gates 114. The metal gates 114 can correspond to gate electrodes of transistors formed in conjunction with the semiconductor substrate 102. In one example, the metal gates 114 are metal gates of gate all around transistors. In this case, the metal gates 114 may cover semiconductor nanosheets, as described above. The semiconductor nanosheets may be covered in one or more layers of dielectric material, corresponding to gate dielectrics, which are in turn covered by the metal gates 114. The nanosheets correspond to channel regions of the gate all around transistor.

The metal gates 114 include one or more layers of conductive material. The conductive material can include one or more of polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, or other types of conductive material. Other materials can be utilized for the metal gates without departing from the scope of the present disclosure.

The metal gates 114 may be covered by sidewall spacers 116. The sidewall spacers 116 can include multiple layers of dielectric material. The multiple layers of dielectric material can include silicon nitride, SiON, SiOCN, SiCN, silicon oxide, or other dielectric materials. Other dielectric materials can be utilized for the sidewall spacers 116 without departing from the scope of the present disclosure.

The integrated circuit 100 includes source and drain regions 110, which in the illustrated embodiment are epitaxial layers. The source and drain epitaxial layers 110 are formed epitaxial lady from the substrate 102. In the example of N channel transistors, the source and drain epitaxial layers 110 can include one or more of Si, SiP, SiC, an in the example of SiCP. In the example of P-channel transistors, the source and drain epitaxial regions 110 can include Si, Ge, or SiGe. The source and drain epitaxial regions 110 may be doped with various N-type and P-type dopants. Other materials and structures can be utilized for the source and drain epitaxial regions 110 without departing from the scope of the present disclosure. The source and drain region epitaxial layers 110 and the metal gate 114 are terminals of a transistor 103.

The integrated circuit 100 includes trenches 120 and 121 formed in the interlayer dielectric layer 108. The trench 120 extends to one of the source and drain epitaxial regions 110. The trench 121 extends to the metal gate 114. A layer of dielectric material 122 covers the top surface of the interlayer dielectric layer 108, the sidewalls of the trenches 120, 121, and the tops of the exposed source and drain epitaxial region 110 and the metal gate 114. In one example, the layer of dielectric material includes silicon nitride, though other materials can be utilized without departing from the scope of the present disclosure.

Figure 1B:
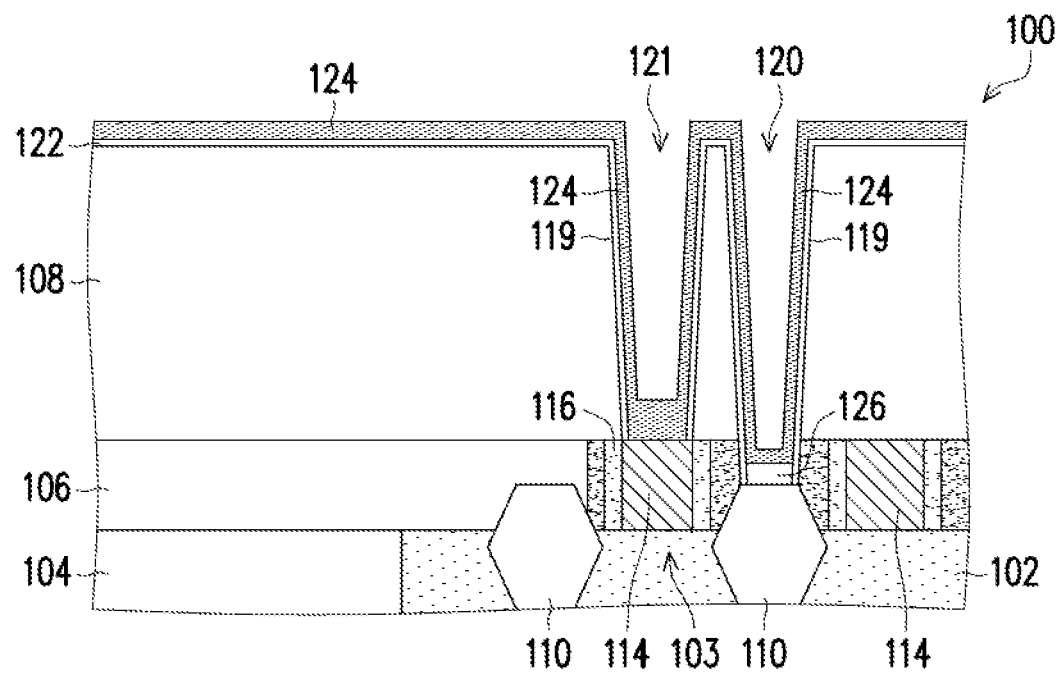

FIG. 1B is a cross-section of the integrated circuit die 100 at an intermediate stage of processing, according to one embodiment. In FIG. 1B, a silicide layer 126 has been formed on the source/drain epitaxial region 110. In FIG. 1B, a layer of titanium nitride 124 has been formed on the top surface of the interlayer dielectric layer 108, on the sidewalls 119 of the trenches 120 and 121, on the metal gate 114, and on the source/drain epitaxial region 110. The layer of titanium nitride 124 can be formed by depositing a layer of titanium on the nitride layer 122 of FIG. 1A. The layer of titanium can be deposited by physical vapor deposition PVD, CVD, or another suitable deposition process. After the layer of titanium has been deposited, the layer of titanium nitride 124 is formed by nitridation of the layer of titanium. The nitridation can be accomplished by flowing NH3 onto the titanium while the temperature is between 350° C. and 450° C. This causes nitrogen to be adsorbed into the titanium. The result is the titanium nitride layer 124. The layer of titanium nitride 124 is a barrier layer that inhibits diffusion of impurities from a metal plug in the trench into other layers and structures.

After the layer of titanium nitride 124 has been formed, silicide 126 is formed at the interface between the source/drain epitaxial region 110 and the titanium nitride layer 124. The silicide 126 is TiSix (TiSi, $TiSi_2$, etc.), where "x" indicates the number of silicon atoms for each titanium atom. The silicide 126 is formed by performing a thermal anneal after the layer of titanium nitride 124 has been deposited. The thermal anneal results in TiSix.

In one embodiment, prior to deposition of the titanium layer, a preclean operation can be performed. The preclean operation can remove native oxides or other undesired material prior to deposition of the titanium.

Figure 1C:
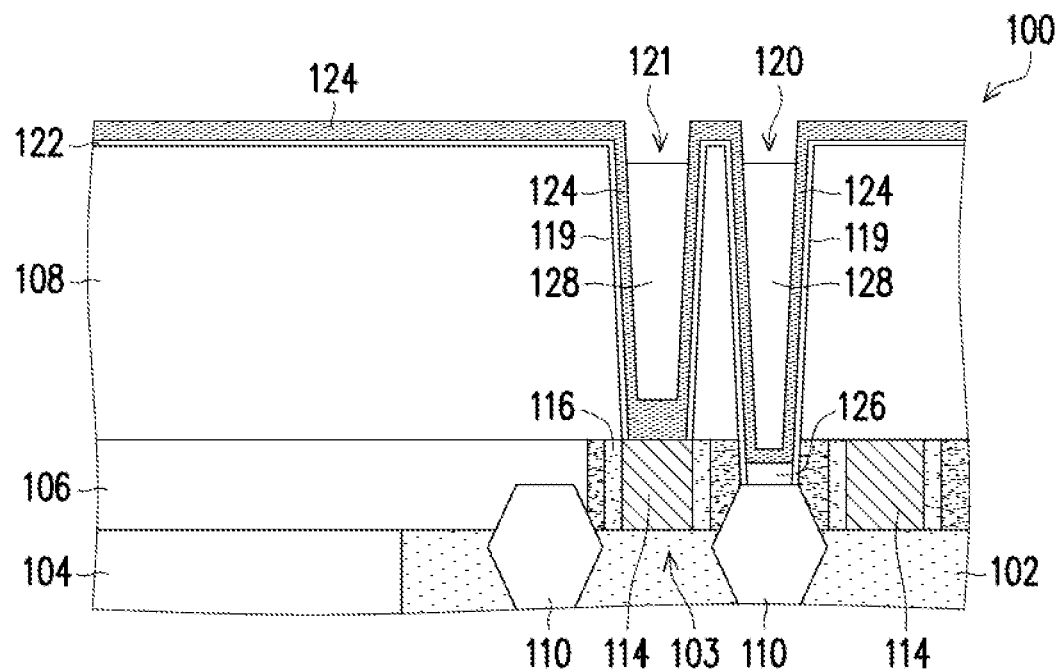

FIG. 1C is a cross-sectional diagram of the integrated circuit 100 at an intermediate stage of processing, according to one embodiment. A bottom antireflective coating 128 has been deposited in the trenches 120 and 121 on the silicon nitride layer 124. The bottom antireflective coating 128 is initially deposited in the trenches 120 and 121 and on the titanium nitride layer 124 above the interlayer dielectric layer 108. After deposition of the bottom antireflective coating 128, a timed etch is performed to remove the bottom antireflective coating 128 from the top of the titanium nitride layer 124 above the interlayer dielectric layer 108. The bottom antireflective coating 128 remains in the trenches 120 and 121. The bottom antireflective coating 128 does not entirely fill the trenches 120 and 121. The bottom antireflective coating 128 can include an organic material or an inorganic material. In one example, the bottom antireflective coating 128 is formed with tetramethyl ammonium hydroxide, though other materials can be utilized without departing from the scope of the present disclosure.

Figure 1D:
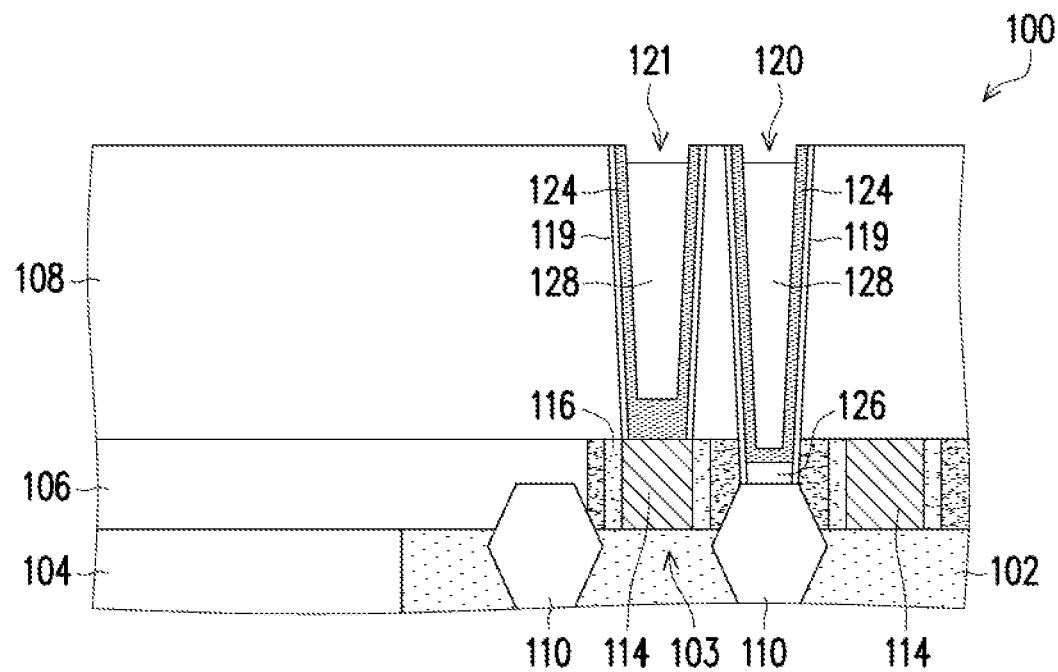

FIG. 1D is a cross-sectional view of the integrated circuit 100 at an intermediate stage of processing, according to one embodiment. The titanium nitride layer 124 has been removed from the top of the interlayer dielectric layer 108.

The titanium nitride layer 124 can be removed by a wet etch. Alternatively, other etching processes can be utilized to remove the titanium nitride.

Figure 1E:
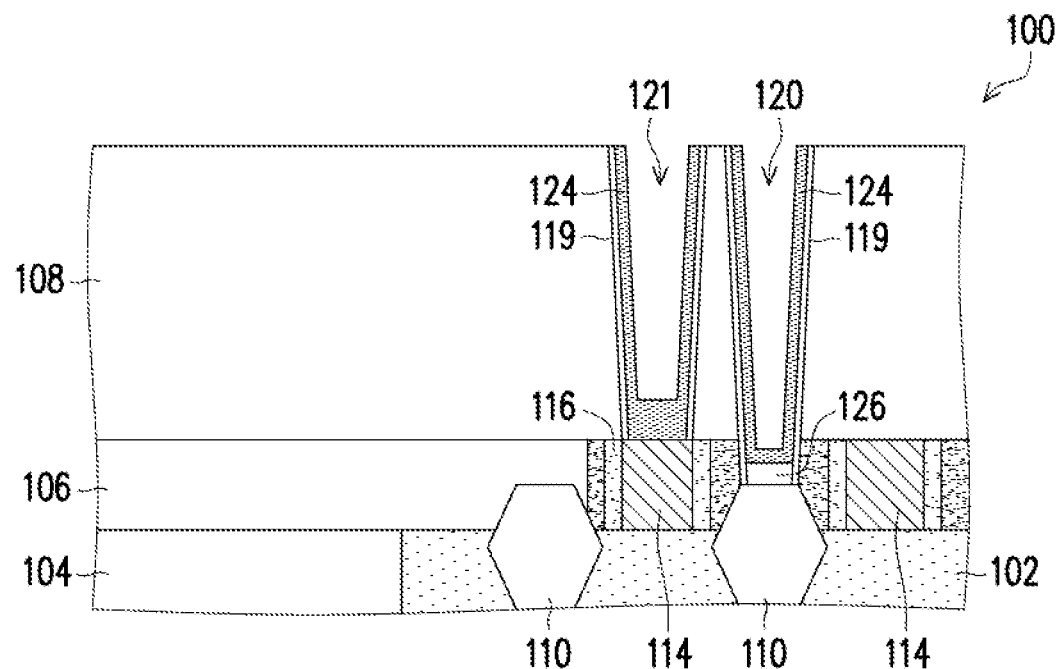

FIG. 1E is a cross-sectional view of the integrated circuit 100 at an intermediate stage of processing, according to one embodiment. In FIG. 1D, the bottom antireflective coating 128 has been removed. The bottom antireflective coating 128 can be removed by performing an etching process. In one example, the etching process includes a plasma ash process in the presence of $O_2$. Other etching processes can be utilized without departing from the scope of the present disclosure.

Figure 1F:
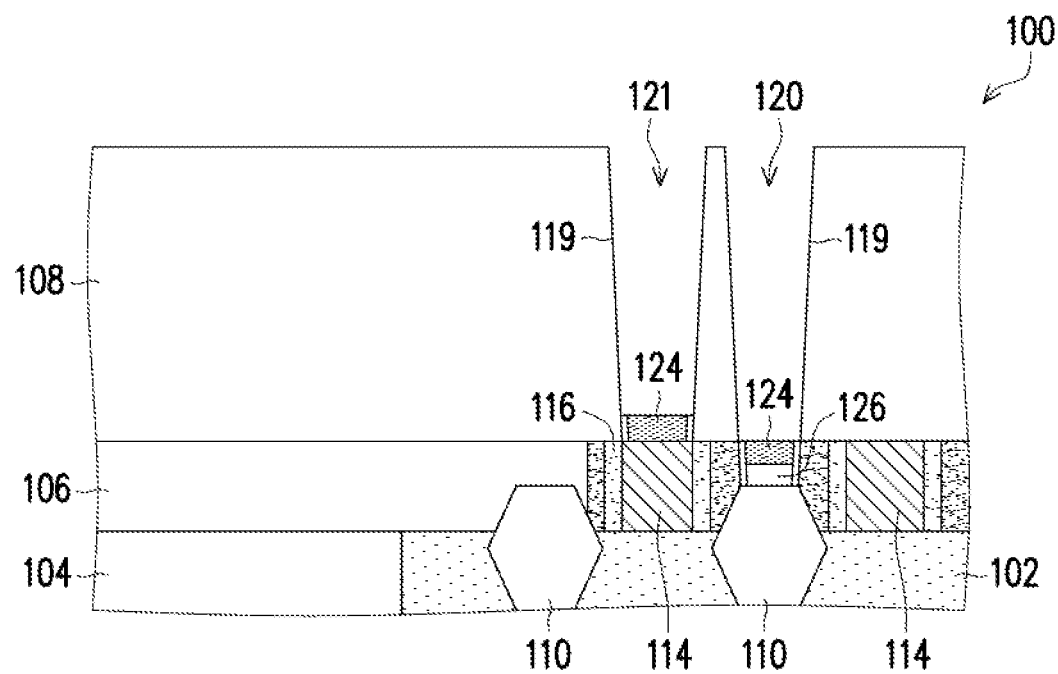

FIG. 1F is a cross-sectional view of the integrated circuit 100 at an intermediate stage of processing, according to one embodiment. In FIG. 1F the titanium nitride layer 124 has been etched and mostly removed from the sidewalls 119 of the trenches 120 and 121. A portion of the titanium nitride layer 124 remains in contact with the sidewalls 119 of the bottom of the trenches 120 and 121. The titanium nitride layer 124 remains on the silicide 126 and on the metal gate 114.

In one embodiment, an atomic layer etching (ALE) process is used to etch the titanium nitride layer 124 to produce the structure shown in FIG. 1F. An ALE process is similar to an atomic layer deposition process (ALD). In the ALE process, different gases, fluids, or materials are flowed into the process chamber for selected periods of time. Each cycle of an ALE process includes flowing multiple materials at different stages. Each cycle can result in the removal of an atomic or molecular layer of the titanium nitride layer 124.

In one example, an ALE cycle includes flowing $WCl_5$ into the process chamber for a selected period of time, for example between 1 s and 10 s. The ALE cycle then includes a purge phase in which argon gas is flowed into the process chamber for a selected period of time, for example between 6 s and 15 s. The ALE cycle then includes flowing $O_2$ into the process chamber for a selected amount of time, for example between 1 s and 10 s. The ALE cycle then includes a second purge phase in which argon gas is flowed into the process chamber for selected period of time, for example between 2 s and 15 s. Each cycle results in the removal of an atomic or molecular layer of the titanium nitride layer 124. By controlling the number of cycles in the ALE process, the amount of the titanium nitride layer 124 to be etched can be tightly controlled. Other ALE processes, cycles, durations, and materials can be utilized without departing from the scope of the present disclosure.

As will be described in more detail below, the machine learning processes are utilized to dynamically select parameters for the ALE process. The machine learning process trains an analysis model to dynamically select the parameters for each ALE process. The analysis model can select materials, flow durations, flow pressures, temperatures, and other parameters associated with ALE processes in order to remove the desired amount of the titanium nitride layer 124.

Figure 1G:
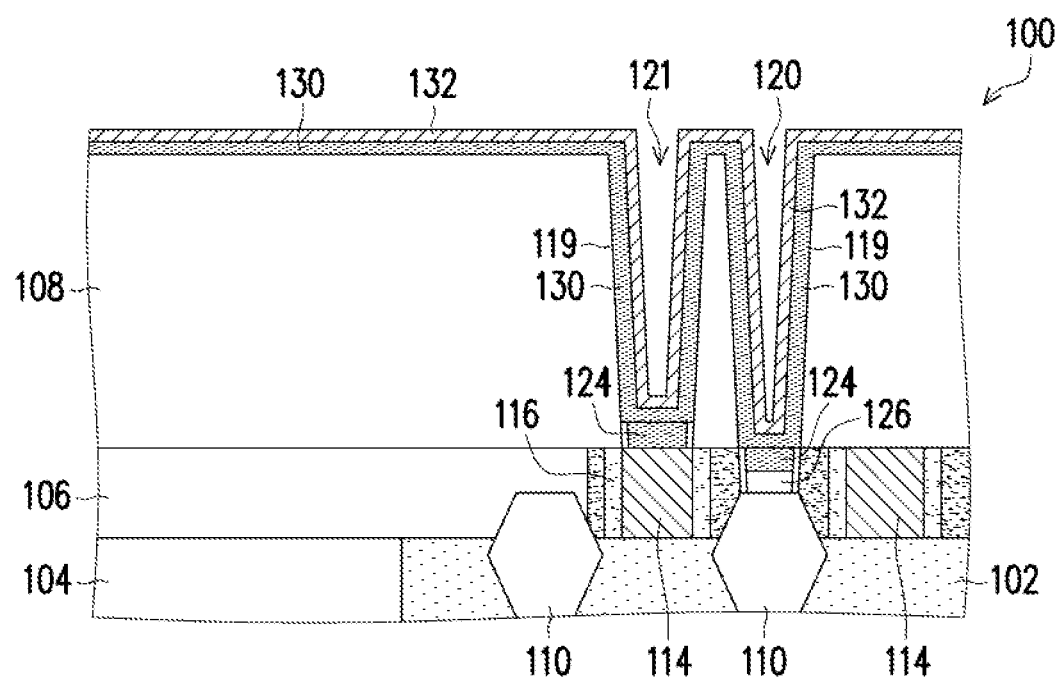

FIG. 1G is a cross-sectional view of the integrated circuit 100, at an intermediate stage of processing, according to one embodiment. In FIG. 1G, a layer of titanium nitride 130 has been deposited on the sidewalls 119 of the trenches 120 and 121 and on top of the interlayer dielectric layer 108. The titanium nitride layer 130 can be a barrier layer. The titanium nitride layer 130 can be deposited with an ALD process. The ALD process deposits the titanium nitride layer 130 to a desired thickness in a highly controlled manner. In particular, the thickness of the titanium nitride layer 130 can be controlled based on the number of ALD cycles utilized for the deposition process. The titanium nitride layer 130 can be deposited using other deposition processes without departing from the scope of the present disclosure. The titanium nitride layer 130 is in contact with the titanium nitride layer 124. The titanium nitride layer 130 differs from the titanium nitride layer 124 in that the titanium nitride layer 130 is formed of an atomic layer deposition process, whereas the titanium nitride layer 124 is formed by nitridation of a titanium layer as described previously in relation to FIG. 1B. Both the titanium nitride layer 130 and the titanium nitride layer 124 are in contact with the sidewalls 119 of the trenches 120 and 121. The titanium nitride layer 130 has a vertical extent in the trenches 120 and 121 higher than the vertical extent of the remaining portion of the titanium nitride layer 124. In one embodiment, a preclean process is performed prior to formation of the titanium nitride layer 130.

In FIG. 1G, a cobalt seed layer 132 is formed on the titanium nitride layer 124. The cobalt seed layer 132 can be deposited by a PVD process. The cobalt seed layer 132 is very thin, for example less than 6 nm in thickness. Other deposition processes and thicknesses for the cobalt seed layer 132 can be utilized without departing from the scope of the present disclosure.

Figure 1H:
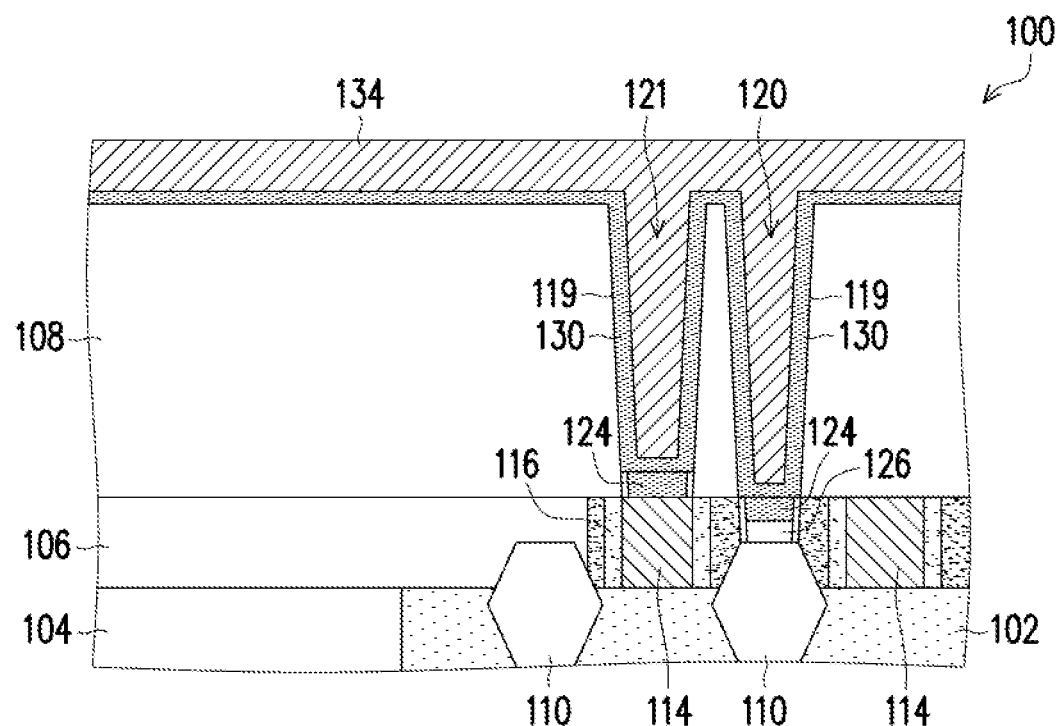

FIG. 1H is a cross-sectional view of the integrated circuit 100 at an intermediate stage of processing, according to one embodiment. In FIG. 1H, a cobalt layer 134 is deposited on the seed layer 132. In particular, the seed layer 132 is used to grow the cobalt layer 134. The cobalt layer 134 fills the trenches 120 and 121. In one example, the cobalt layer 134 is deposited by an electroless cobalt plating process. The electroless cobalt plating process grows the cobalt layer 134 from the seed layer 130. The seed layer 130 is not labeled in FIG. 1H because the seed layer 130 has been subsumed by the cobalt layer 134. Other processes can be utilized to deposit a cobalt layer 134 without departing from the scope of the present disclosure.

Figure 1I:
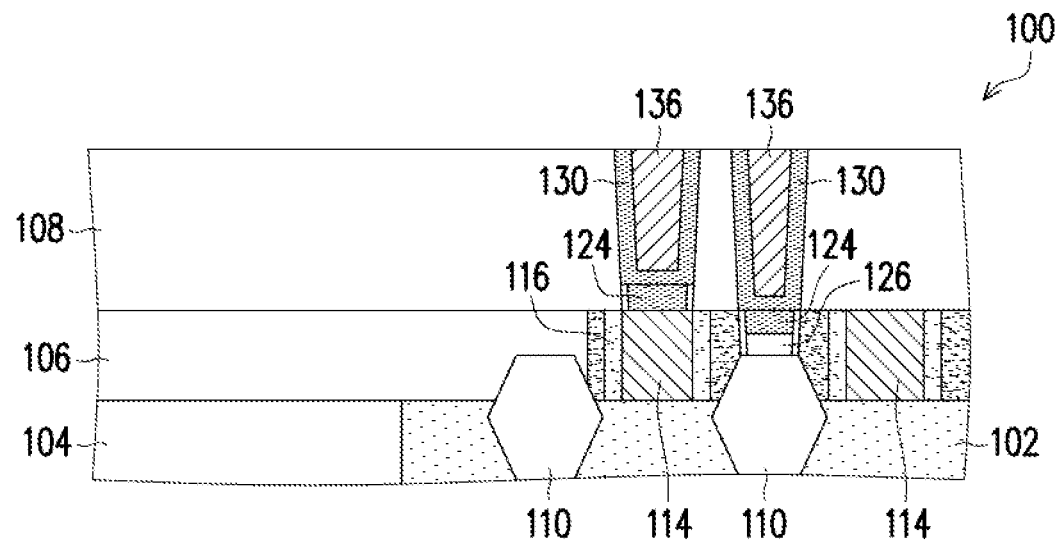

FIG. 1I is a cross-sectional view of the integrated circuit 100 at an intermediate stage of processing, according to one embodiment. In FIG. 1I, a chemical mechanical planarization process (CMP) has been performed. The CMP process removes the cobalt layer 134 and the titanium nitride layer 130 from on top of the interlayer dielectric layer 108. Furthermore, the CMP process removes a portion of the interlayer dielectric layer 108. This process results in cobalt plugs 136 been formed in the trenches 120 and 121. The cobalt plugs 136 are positioned on the titanium nitride layer 124 and the titanium nitride layer 130. Other processes can be utilized to form the cobtalt plugs 136 without departing from the scope of the present disclosure.

Figure 1J:
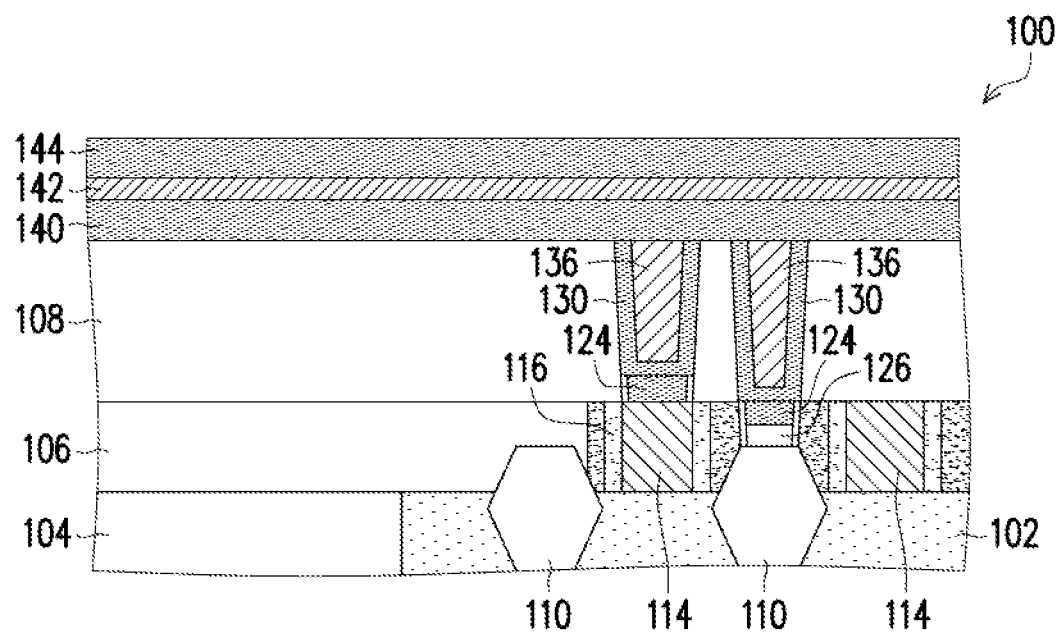

FIG. 1J is a cross-sectional view of the integrated circuit 100 at an intermediate stage of processing, according to one embodiment. In FIG. 1J, a MCESL layer 140 has been deposited on the interlayer dielectric layer 108 and on the cobalt plugs 136. In one example, the MCESL layer 140 has a thickness between 100 Å and 140 Å. The MCESL layer can be formed by physical vapor deposition, chemical vapor deposition, atomic layer deposition, or other suitable deposition processes. Other processes and thicknesses can be utilized for the MCESL layer 140 without departing from the scope of the present disclosure.

A titanium nitride layer 142 has been deposited on the MCESL layer 140. The titanium nitride layer 142 has a thickness between 40 Å and 80 Å. The titanium nitride layer 142 can be a high resistance titanium nitride layer formed by a PVD process. Other processes and thicknesses can be utilized for the titanium nitride layer 142 without departing from the scope of the present disclosure.

A MCESL layer 144 has been deposited on the titanium nitride layer 142. In one example, the MCESL layer 144 has a thickness between 70 Å and 110 Å. The MCESL layer 144 can be formed by a PVD process, a CVD process, an ALD process, or other suitable deposition processes. Other processes and thicknesses can be utilized for the MCESL layer 144 without departing from the scope of the present disclosure.

Figure 1K:
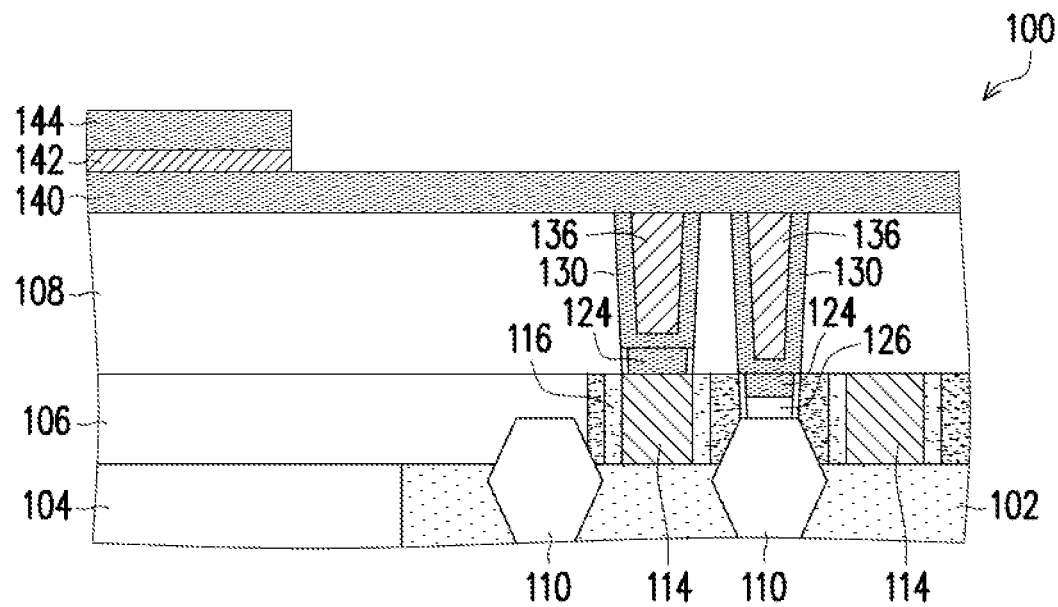

FIG. 1K is a cross-sectional view of the integrated circuit 100 at an intermediate stage of processing, according to one embodiment. In FIG. 1K, a photolithography process is utilized to pattern the edge the titanium nitride layer 142 and the MCESL layer 144. This exposes a portion of the MCESL layer 140. The photolithography process can include depositing and patterning photo resist and performing a wet etch, a dry etch, or another type of etch.

Figure 1L:
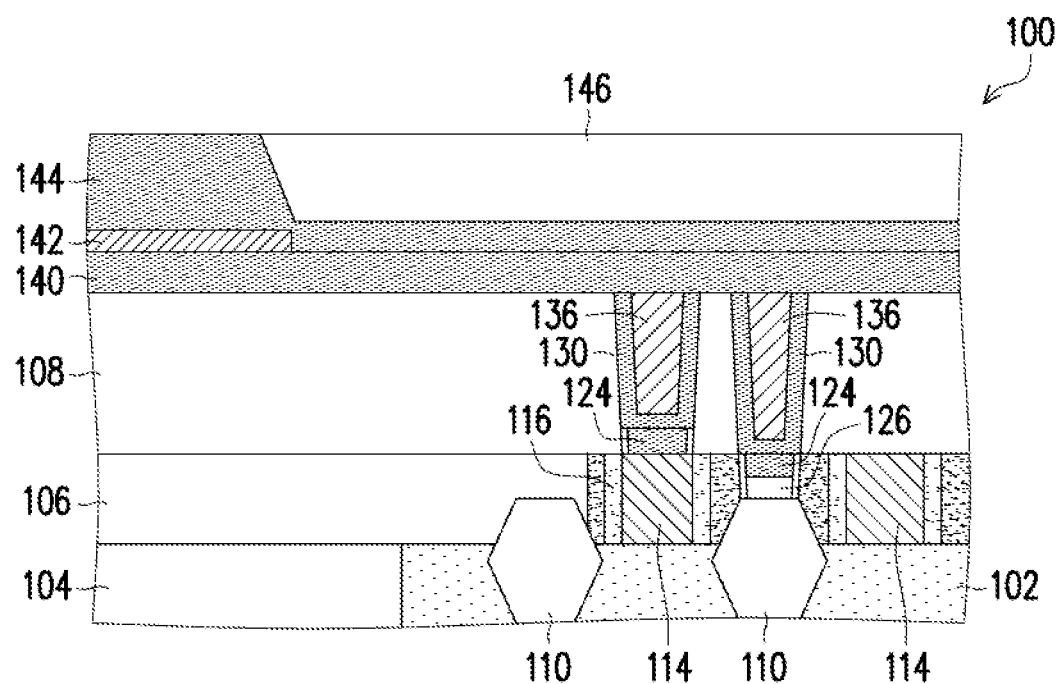

FIG. 1L is a cross-sectional view of the integrated circuit 100 at an intermediate stage of processing, according to one embodiment. In FIG. 1L, the MCESL layer 144 has been redeposited. In particular, a further 80 Å-120 Å of MCESL has been added to the Layer 144. Additionally, an interlayer dielectric layer 146 has been deposited. The interlayer dielectric layer 146 can include silicon oxide. The interlayer dielectric layer 146 can be deposited by CVD, PVD, or other suitable deposition processes. Other materials and processes can be utilized for the interlayer dielectric layer 146 without departing from the scope of the present disclosure.

Figure 1M:
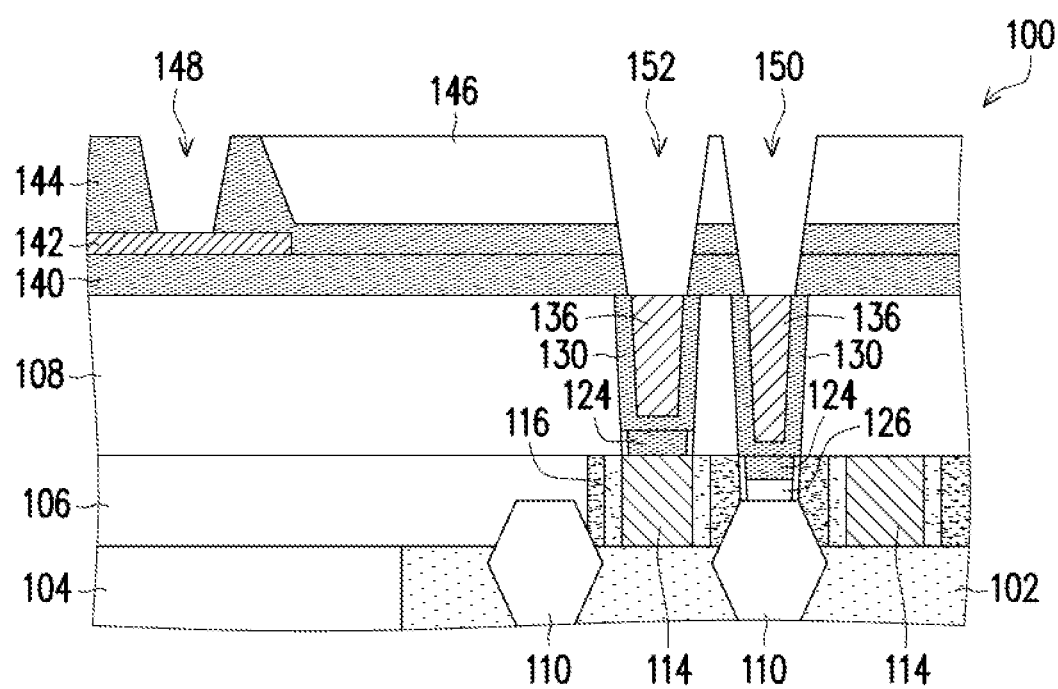

FIG. 1M is a cross-sectional view of the integrated circuit 100 at an intermediate stage of processing, according to one embodiment. In FIG. 1M, trenches 148, 150, and 152 have been opened and the MCESL layer 144, the interlayer dielectric layer 146, and in the MCESL layer 140, exposing the titanium nitride layer 142 and the cobalt plugs 136. The trenches can be formed by a wet etch, a dry etch, or another type of etch.

Figure 1N:
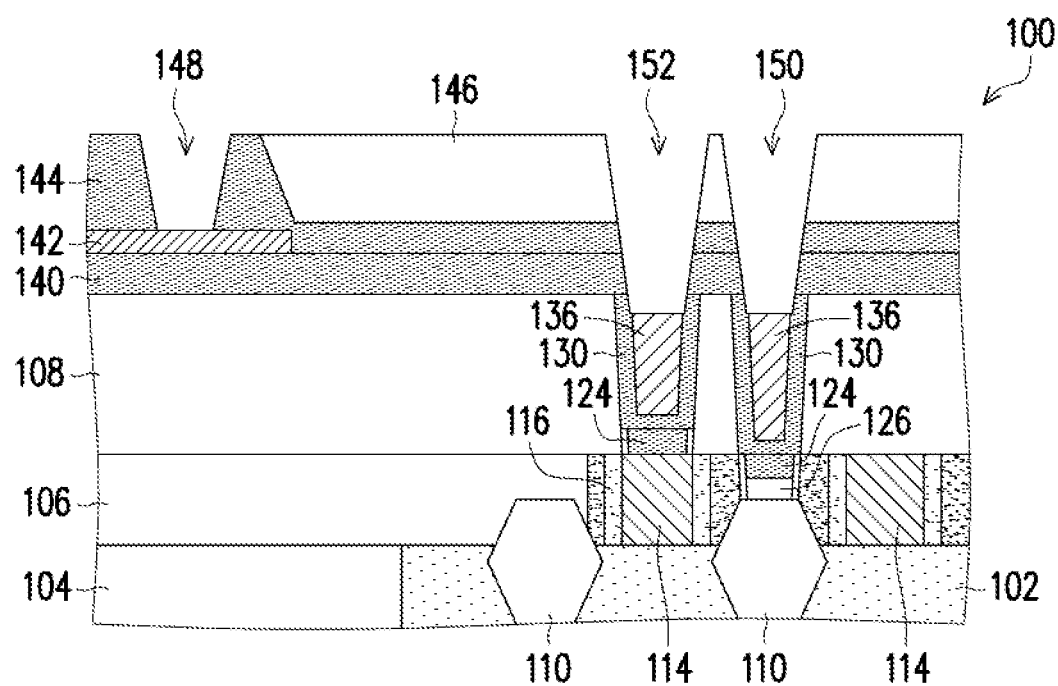

FIG. 1N is a cross-sectional view of the integrated circuit 100 at an intermediate stage of processing, according to one embodiment. In FIG. 1N a portion of the cobalt plugs 136 has been removed via a wet etch.

Figure 1O:
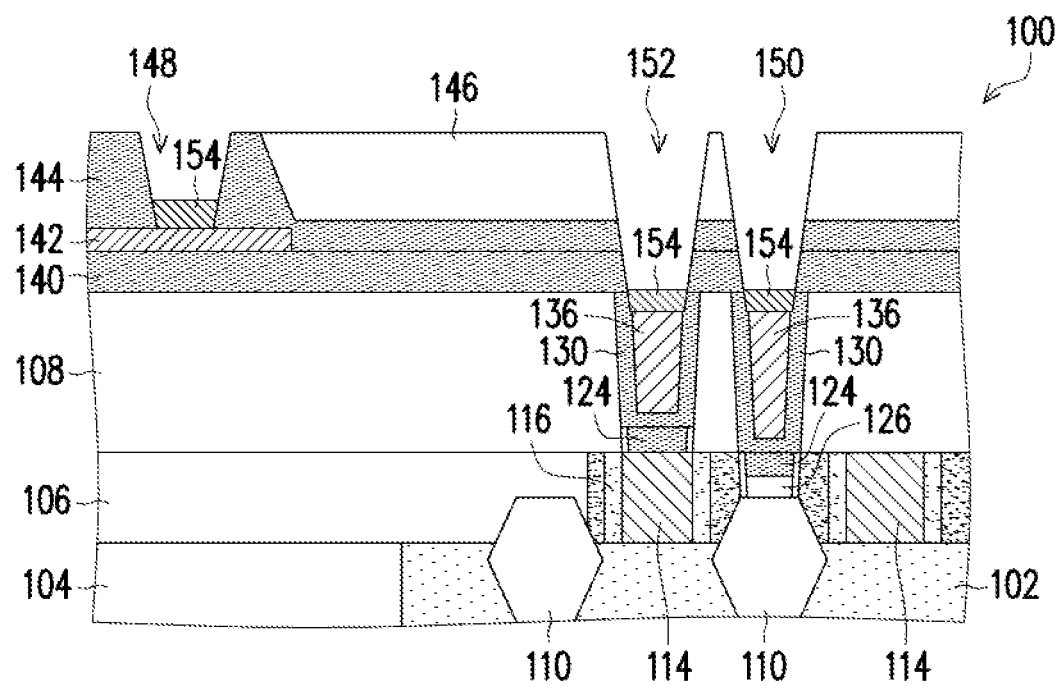

FIG. 1O is a cross-sectional view of the integrated circuit 100 at an intermediate stage of processing, according to one embodiment. In FIG. 1O, caps 154 have been formed on the exposed cobalt plugs 136 and on the exposed portion of the titanium nitride layer 142. The caps 154 can include tungsten and can be formed with a bottom up deposition. Other materials and deposition processes can be utilized for the caps 154 without departing from the scope of the present disclosure.

Figure 1P:
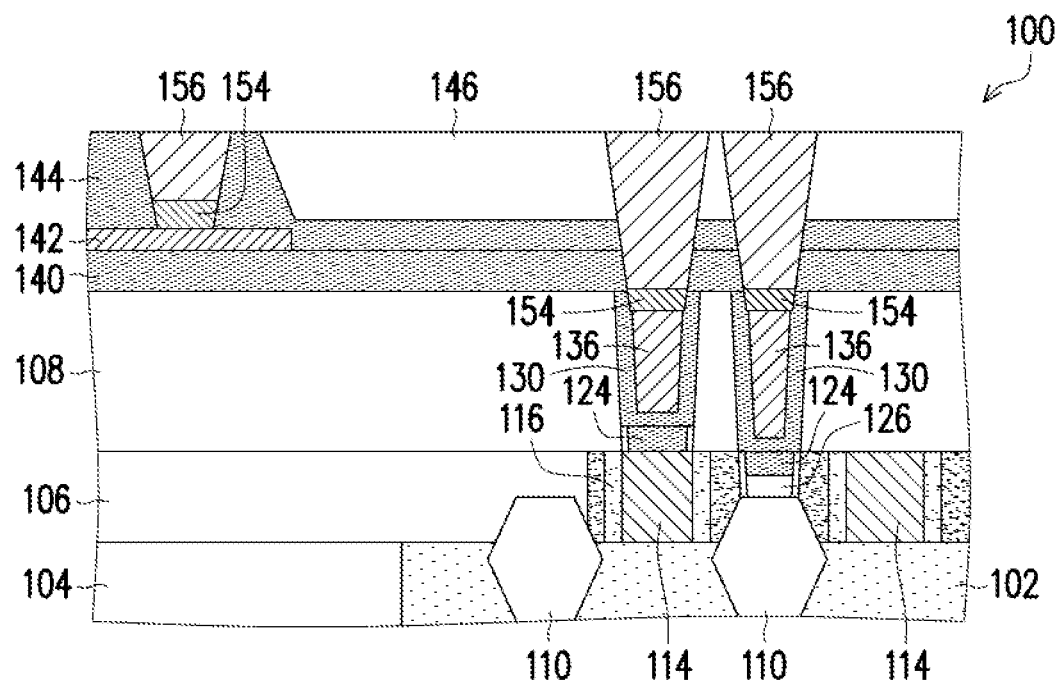

FIG. 1P is a cross-sectional view of the integrated circuit 100 at an intermediate stage of processing, according to one embodiment. In FIG. 1P, conductive plugs 156 have been formed in the trenches 148, 150, and 152 in contact with the caps 154. The conductive plugs 156 are electrically connected to the plugs 136 and the titanium nitride layer 142. The conductive plugs 156 can include ruthenium and can be deposited with a bottom up ex-situ deposition process. Other materials and deposition processes can be utilized for the plugs 156. A CMP process can be performed to planarize the tops of the plugs 156, the layer 144, and the interlayer dielectric layer 146 without departing from the scope of the present disclosure.

Figure 1Q:
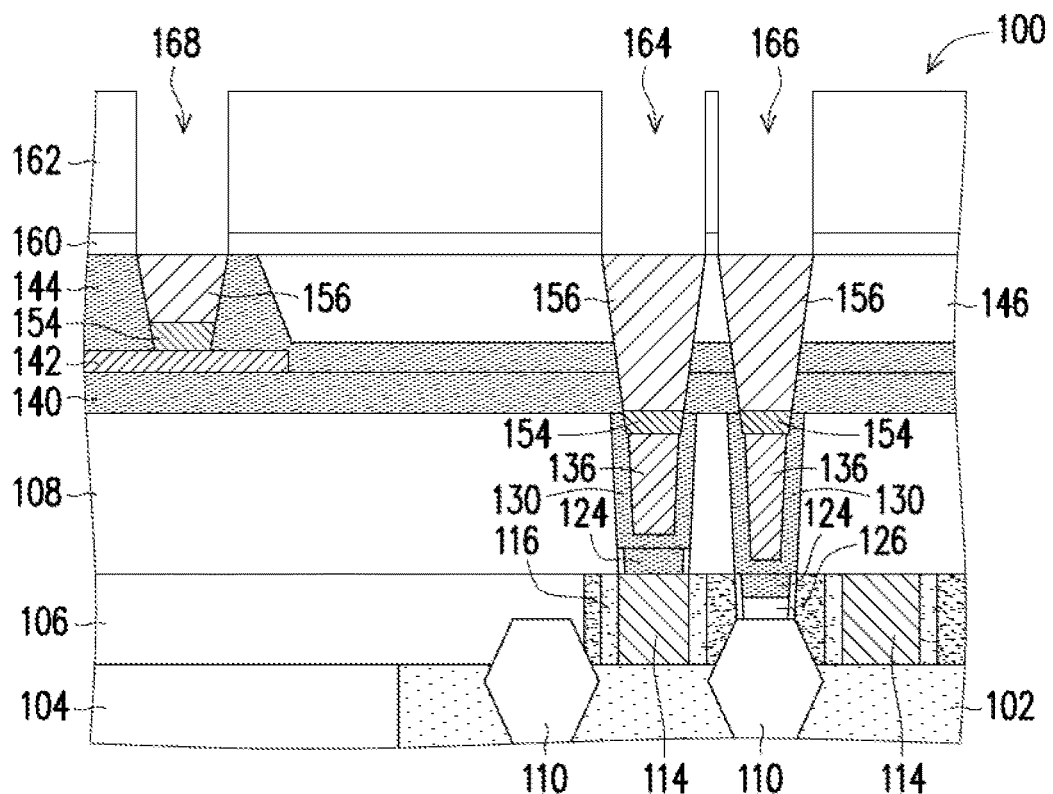

FIG. 1Q is a cross-sectional view of the integrated circuit 100 at an intermediate stage of processing, according to one embodiment. In FIG. 1Q an aluminum oxide layer 160 and a low K dielectric layer 162 have been deposited. The low K dielectric layer 162 can include a porous silicon oxide, an organosilicate glass, or other types of low K dielectrics.

Other materials can be utilized than those described above without departing from the scope of the present disclosure.

The aluminum oxide layer 160 and the low K dielectric layer 162 have been patterned and etched to form trenches 164, 166, and 168 exposing the conductive plugs 156. The trenches 164, 166, and 168 can be formed using standard photolithography and etching techniques including patterning photoresist and performing a wet or dry etch.

Figure 1R:
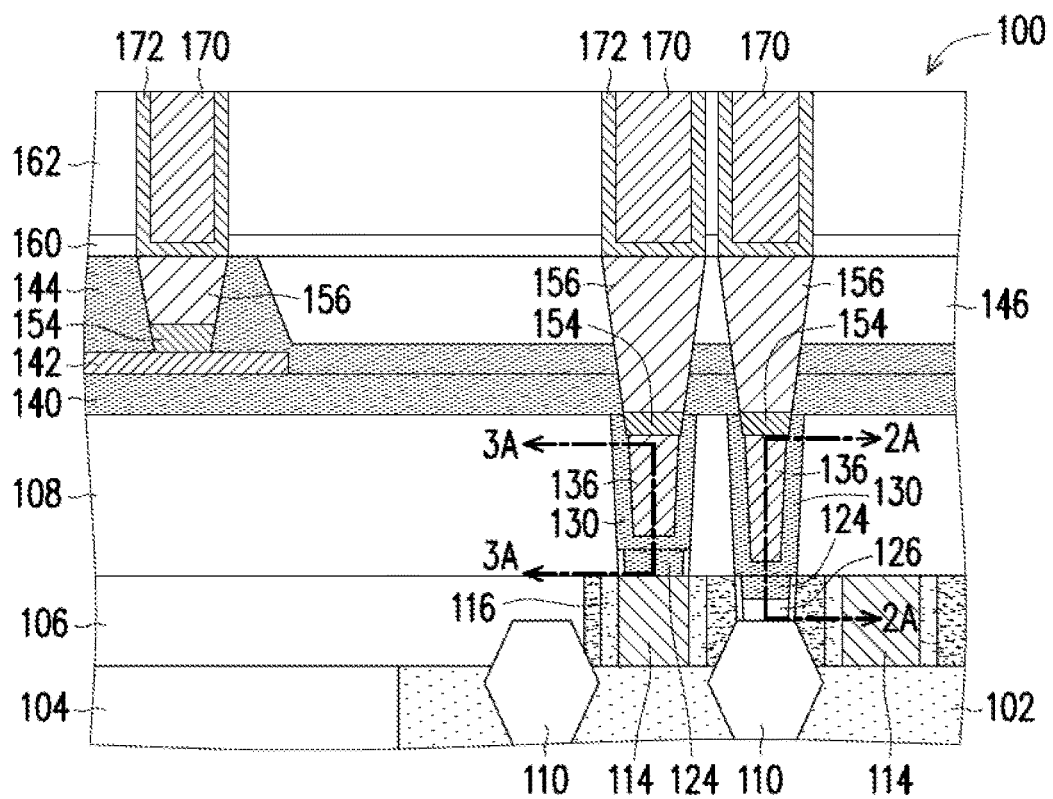

FIG. 1R is a cross-sectional view of the integrated circuit 100, according to one embodiment. In FIG. 1R, copper plugs 170 have been formed in the trenches 164, 166, and 168. The copper plugs 170 can be formed by depositing a copper seed layer 172 using a physical vapor deposition or another suitable process. After the copper seed layer 172 has been formed, the copper plugs 170 can be formed by an electroless copper plating process. A CMP process can be performed after the copper plugs 170 have been formed. Other processes and materials can be utilized without departing from the scope of the present disclosure.

Figure 2A:
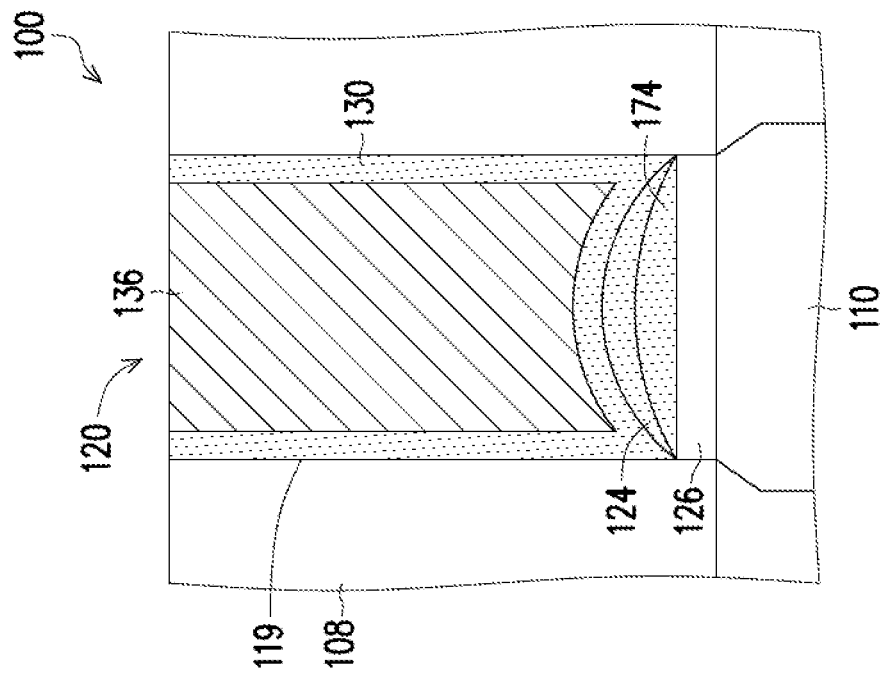
FIG. 2A is an enlarged cross-sectional views of a source/drain contact plug of an integrated circuit, according to one embodiment.

FIG. 2A is an enlarged cross-sectional view (along line 2A-2A in FIG. 1R) of the integrated circuit 100 of FIGS. 1A-1R, according to one embodiment. The view of FIG. 2A focuses on the area of the cobalt plug 136 that contacts the source/drain epitaxial region 110. The view of FIG. 2A illustrates a portion 174 of a titanium layer deposited as part of the process to form the titanium nitride layer 124 via nitridation. The portion 174 of the titanium layer is positioned in contact with the silicide layer 126. The titanium nitride layer 124, formed by nitridation as described previously, is positioned on the titanium layer 174 and in contact with a lower portion of the side wall 119 of the trench 120 formed in the interlayer dielectric layer 108. The titanium nitride layer 130, formed with an ALD process as described previously, is positioned on the titanium nitride layer 124 and in contact with upper portions of the sidewalls 119 of the trench 120.

The structure FIG. 2A has a benefit of providing low current leakage. Due to the extra buffer provided by the titanium nitride layer 124 in contact with the lower portions of the sidewalls 119 of the trench 120. The structure can be formed by carefully controlling the ALE process described previously. In particular, the ALE process can be performed in such a way to ensure that a portion of the titanium nitride layer 124 remains on the sidewalls 119 of the trench 120.

Figure 2B:
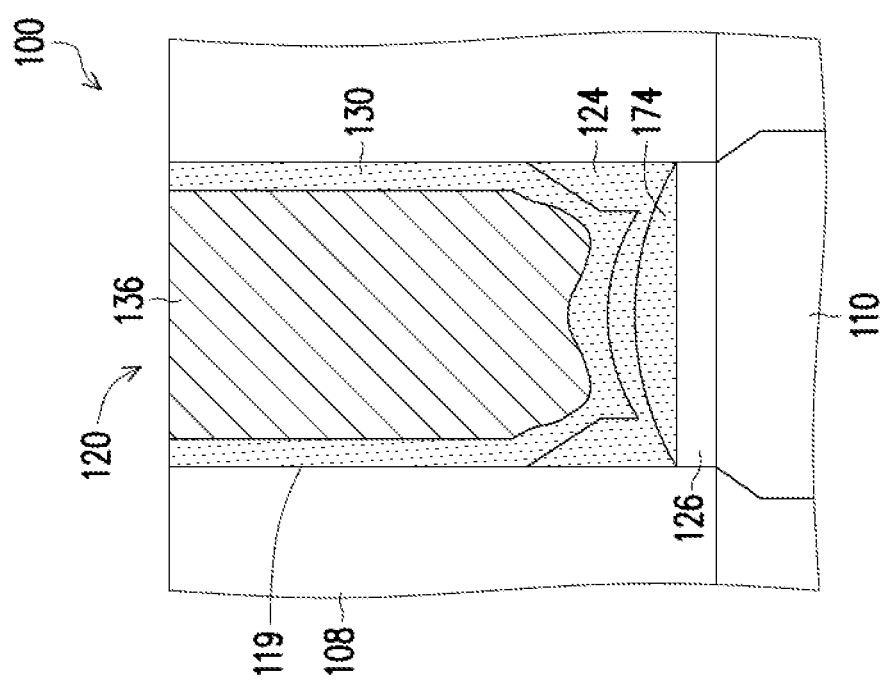
FIG. 2B is an enlarged cross-sectional views of a source/drain contact plug of an integrated circuit, according to one embodiment.

FIG. 2B is an enlarged cross-sectional view (along line 2A-2A in FIG. 1R) of the integrated circuit 100 of FIGS. 1A-1R, according to an alternate embodiment. In the embodiment of FIG. 2B, the ALE process has been carefully controlled to ensure that none of the titanium nitride layer 124 remains on the sidewalls 119 of the trench 120. This has the benefit of providing a low resistance contact to the source/drain epitaxial region 110.

Figure 3A:
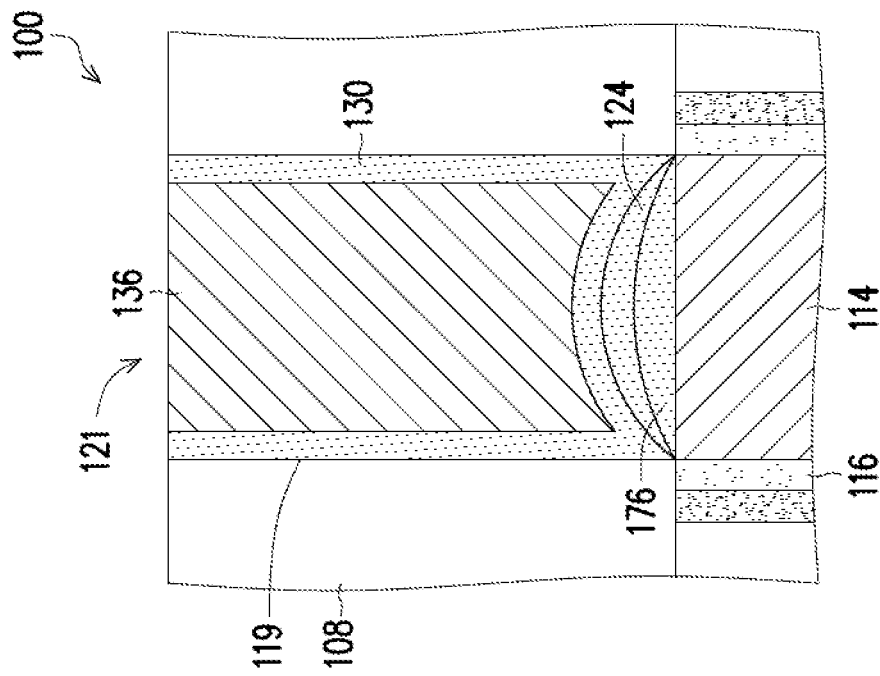
FIG. 3A is an enlarged cross-sectional views of a gate contact plug of an integrated circuit, according to one embodiment.

FIG. 3A is an enlarged cross-sectional view (along line 3A-3A in FIG. 1R) of the integrated circuit 100 of FIGS. 1A-1R, according to one embodiment. The view of FIG. 3A focuses on the cobalt plug 136 that contacts the metal gate 114. The view of FIG. 3A illustrates a portion 176 of a titanium layer deposited as part of the process to form the titanium nitride layer 120 via nitridation. The portion 176 of the titanium layer is positioned in contact with the metal gate 114. The titanium nitride layer 124, formed by nitridation as described previously, is positioned on the titanium layer 176 and in contact with a lower portion of the side wall 119 of the trench 121 formed in the interlayer dielectric layer 108. The titanium nitride layer 130 formed with an ALD process as described previously is positioned on the titanium nitride layer 124 and in contact with upper portions of the sidewalls 119 of the trench 121.

The structure FIG. 3A has a benefit of providing low current leakage. Due to the extra buffer provided by the titanium nitride layer 124 in contact with the lower portions of the sidewalls 119 of the trench 121. The structure can be formed by carefully controlling the ALE process described previously. In particular, the ALE process can be performed in such a way to ensure that a portion of the titanium nitride layer 124 remains on the sidewalls 119 of the trench 121.

Figure 3B:
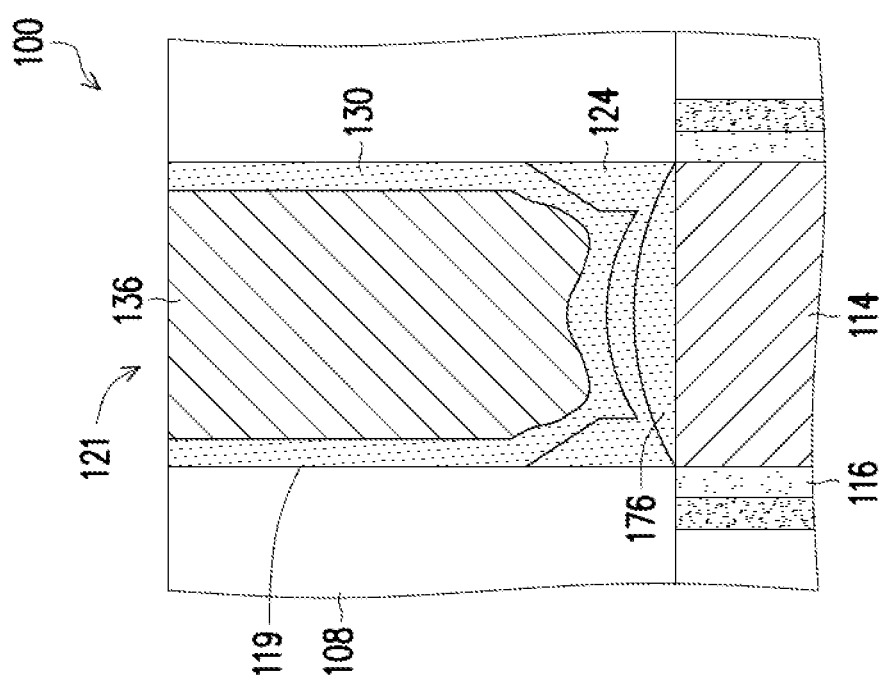
FIG. 3B is an enlarged cross-sectional views of a gate contact plug of an integrated circuit, according to one embodiment.

FIG. 3B is an enlarged cross-sectional view (along line 3A-3A in FIG. 1R) of the integrated circuit 100 of FIGS. 1A-1R, according to an alternate embodiment. In the embodiment of FIG. 3B, the ALE process has been carefully controlled to ensure that none of the titanium nitride layer 124 remains on the sidewalls 119 of the trench 121. This has the benefit of providing a low resistance contact to the metal gate 114.

Figure 4A:
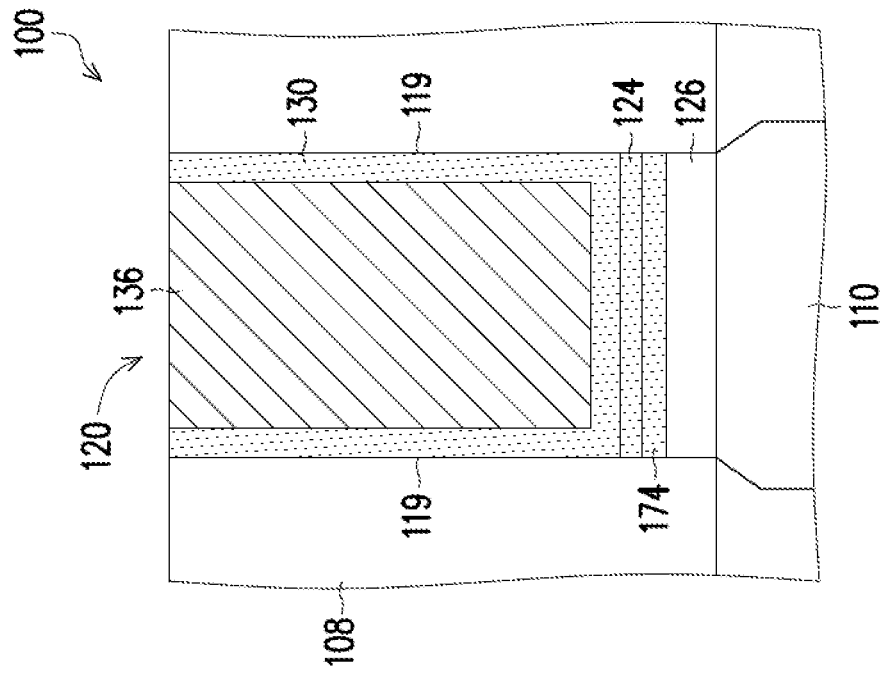
FIG. 4A is an enlarged cross-sectional views of a source/drain contact plug of an integrated circuit, according to one embodiment.
Figure 4B:
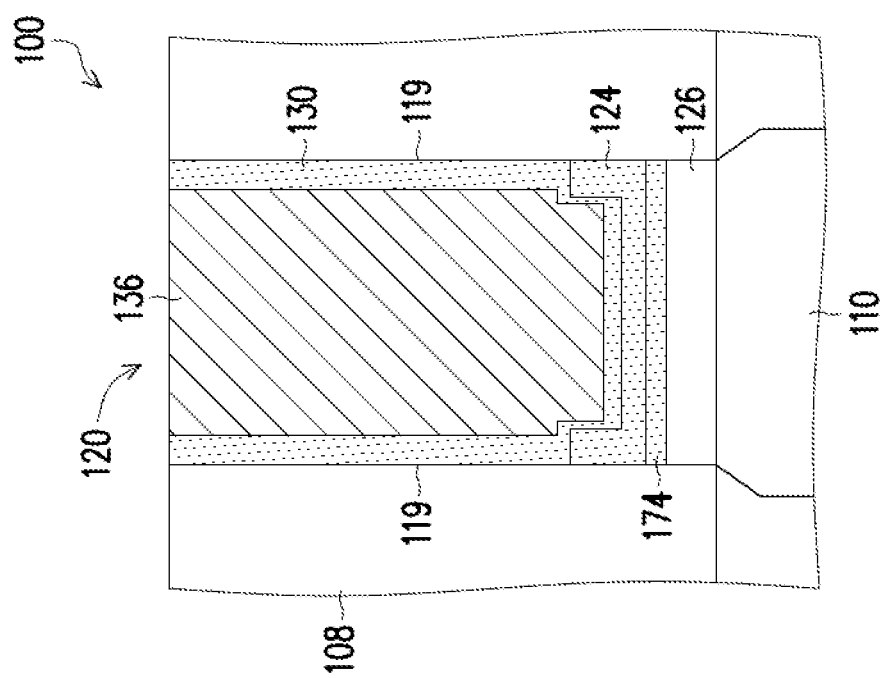
FIG. 4B is an enlarged cross-sectional views of a source/drain contact plug of an integrated circuit, according to one embodiment.

FIG. 4A is an enlarged cross-sectional view (along line 2A-2A in FIG. 1R) of the integrated circuit 100 of FIGS. 1A-1R, according to one embodiment. The structure of FIG. 4A is substantially similar to the structure of FIG. 2A, except that the titanium nitride layers 124 and 130, and the titanium layer 174 have flat profiles rather than curved profiles. FIG. 4B is an enlarged cross-sectional view (along line 2A-2A in FIG. 1R) of the integrated circuit 100 of FIGS. 1A-1R, according to an alternate embodiment. The structure of FIG. 4B is substantially similar to the structure of FIG. 2B except that the titanium nitride layers 124 and 130, and the titanium layer 174 have flat profiles rather than curved profiles.

Figure 5B:
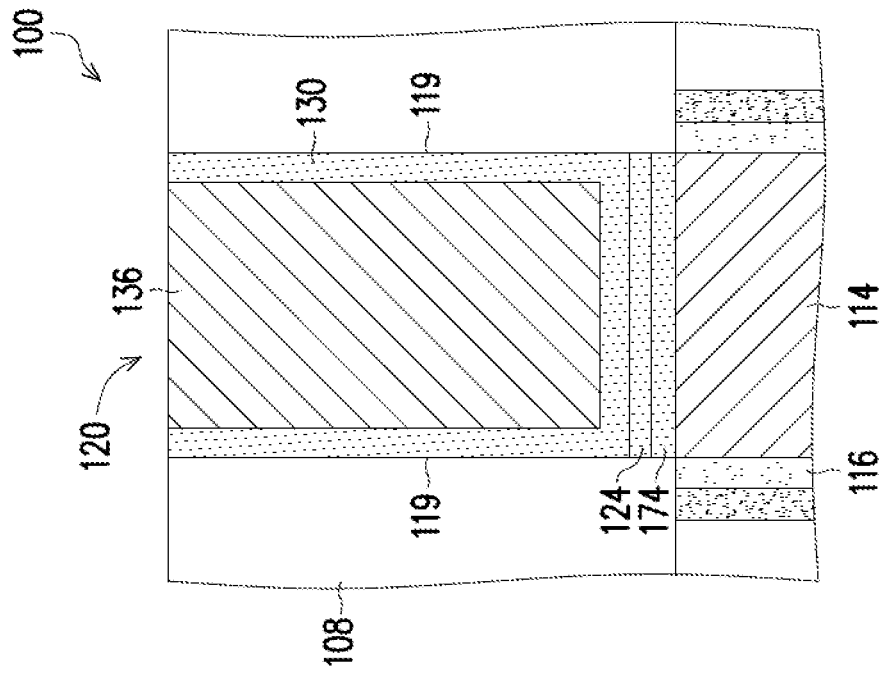
FIG. 5B is an enlarged cross-sectional views of a gate contact plug of an integrated circuit, according to one embodiment.
Figure 5A:
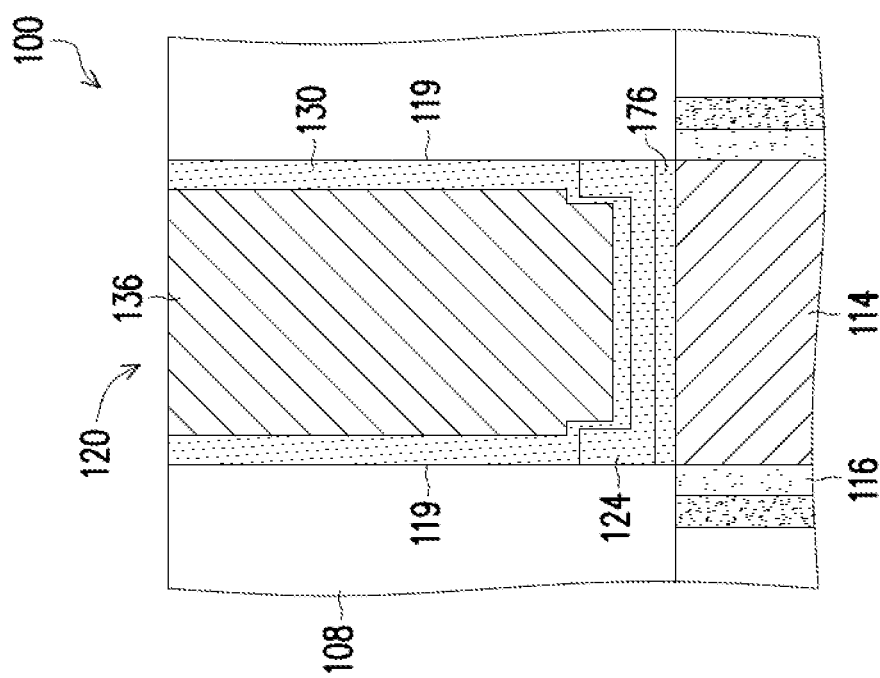
FIG. 5A is an enlarged cross-sectional views of a gate contact plug of an integrated circuit, according to one embodiment.

FIG. 5A is an enlarged cross-sectional view (along line 3A-3A in FIG. 1R) of the integrated circuit 100 of FIGS. 1A-1R, according to one embodiment. The structure of FIG. 5A is substantially similar to the structure of FIG. 3A, except that the titanium nitride layers 124 and 130, and the titanium layer 176 have flat profiles rather than curved profiles. FIG. 5B is an enlarged cross-sectional view (along line 3A-3A in FIG. 1R) of the integrated circuit 100 of FIGS. 1A-1R, according to an alternate embodiment. The structure of FIG. 5B is substantially similar to the structure of FIG. 3B except that the titanium nitride layers 124 and 130, and the titanium layer 176 have flat profiles rather than curved profiles.

Figure 6A:
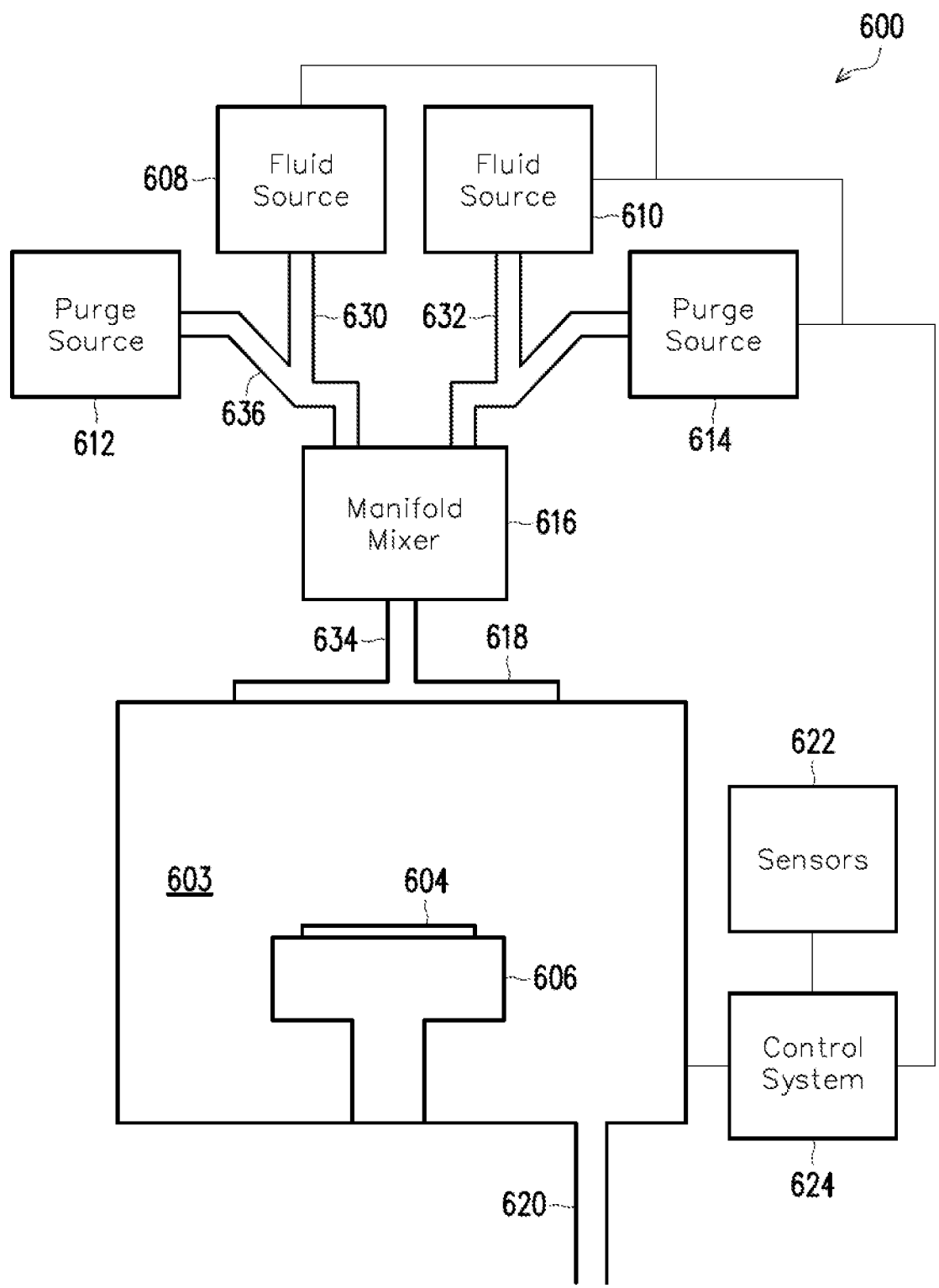
FIG. 6A is an illustration of a semiconductor process system, according to one embodiment.

FIG. 6A is an illustration of a semiconductor process system 600, according to one embodiment. The semiconductor process system 600 can be utilized to perform ALE processes in conjunction with the processes and structures shown and described in relation to FIGS. 1A-5B. The semiconductor process system 600 includes a process chamber 602 including an interior volume 603. A support 606 is positioned within the interior volume 603 and is configured to support a substrate 604 during a thin-film etching process. The semiconductor process system 600 is configured to etch a thin film on the substrate 604. The semiconductor process system 600 includes a control system 624 that dynamically adjusts thin-film etching parameters. Details of the control system 624 are provided after description of the operation of the semiconductor process system 600.

In one embodiment, the semiconductor process system 600 includes a first fluid source 608 and a second fluid source 610. The first fluid source 608 supplies a first fluid into the interior volume 603. The second fluid source 610 supplies a second fluid into the interior volume 603. The first and second fluids both contribute in etching a thin film on the substrate 604. While FIG. 6A illustrates fluid sources 608 and 610, in practice, the fluid sources 608 and 610 may include or supply materials other than fluids. For example, the fluid sources 608 and 610 may include material sources that provide all materials for the etching process.

In one embodiment, the semiconductor process system 600 is an ALE system that performs ALE processes. The ALE system performs etching processes in cycles. Each cycle includes flowing a first etching fluid from the fluid source 608, followed by purging the first etching fluid from the etching chamber by flowing the purge gas from one or both of the purge sources 612 and 624, followed by flowing a second etching fluid from the fluid source 610, followed by purging the second etching fluid from the etching chamber by flowing the purge gas from one or both of the purge sources 612 and 624. This corresponds to a single ALE cycle. Each cycle etches an atomic or molecular layer from the thin-film that is being etched.

The parameters of a thin film generated by the semiconductor process system 600 can be affected by large number of process conditions. The process conditions can include, but are not limited to, an amount of fluid or material remaining in the fluid sources 608, 610, a flow rate of fluid or material from the fluid sources 608, 610, the pressure of fluids provided by the fluid sources 608 and 610, the length of tubes or conduits that carry fluid or material into the process chamber 602, the age of an ampoule defining or included in the process chamber 602, the temperature within the process chamber 602, the humidity within the process chamber 602, the pressure within the process chamber 602, light absorption a reflection within the process chamber 602, surface features of the semiconductor wafer 604, the composition of materials provided by the fluid sources 608 and 610, the phase of materials provided by the fluid sources 608 and 610, the duration of the etching process, the duration of individual phases of the etching process, and various other factors, including factors not specifically listed above.

The combination of the various process conditions during the etching process determines the remaining thickness a thin film etched by the ALE process. It is possible that process conditions may result in thin films that do not have remaining thicknesses that fall within target parameters. If this happens, then integrated circuits formed from the semiconductor wafer 604 may not function properly. The quality of batches of semiconductor wafers may suffer. In some cases, some semiconductor wafers may need to be scrapped.

The semiconductor process system 600 utilizes the control system 624 to dynamically adjust process conditions to ensure that etching processes result in thin films having parameters or characteristics that fall within target parameters or characteristics. The control system 624 is connected to processing equipment associated with the semiconductor process system 600. The processing equipment can include components shown in FIG. 6A and components not shown in FIG. 6A. The control system 624 can control the flow rate of material from the fluid sources 608 and 610, the temperature of materials supplied by the fluid sources 608 and 610, the pressure of fluids provided by the fluid sources 608 and 610, the flow rate of material from purge sources 612 and 614, the duration of flow of materials from the fluid sources 608 and 610 and the purge sources 612 of 614, the temperature within the process chamber 602, the pressure within the process chamber 602, the humidity within the process chamber 602, and other aspects of the thin-film etching process. The control system 624 controls these process parameters so that the thin-film etching process results in a thin-film having target parameters such as a target remaining thickness, a target composition, a target crystal orientation, etc. Further details regarding the control system are provided in relation to FIGS. 7-9.

In one embodiment, the control system 624 is communicatively coupled to the first and second fluid sources 608, 610 via one or more communication channels 625. The control system 624 can send signals to the first fluid source 608 and the second fluid source 610 via the communication channels 625. The control system 624 can control functionality of the first and second fluid sources 608, 610 responsive, in part, to the sensor signals from the byproduct sensor 622.

In one embodiment, the semiconductor process system 600 can include one or more valves, pumps, or other flow control mechanisms for controlling the flow rate of the first fluid from the first fluid source 608. These flow control mechanisms may be part of the fluid source 608 or may be separate from the fluid source 608. The control system 624 can be communicatively coupled to these flow control mechanisms or to systems that control these flow control mechanisms. The control system 624 can control the flow-rate of the first fluid by controlling these mechanisms. The control system 600 may include valves, pumps, or other flow control mechanisms that control the flow of the second fluid from the second fluid source 610 in the same manner as described above in reference to the first fluid and the first fluid source 608.

In one embodiment, the semiconductor process system 600 includes a manifold mixer 616 and a fluid distributor 618. The manifold mixer 616 receives the first and second fluids, either together or separately, from the first fluid source 608 and the second fluid source 610. The manifold mixer 616 provides either the first fluid, the second fluid, or a mixture of the first and second fluids to the fluid distributor 618. The fluid distributor 618 receives one or more fluids from the manifold mixer 616 and distributes the one or more fluids into the interior volume 603 of the process chamber 602.

In one embodiment, the first fluid source 608 is coupled to the manifold mixer 616 by a first fluid channel 630. The first fluid channel 630 carries the first fluid from the fluid source 608 to the manifold mixer 616. The first fluid channel 630 can be a tube, pipe, or other suitable channel for passing the first fluid from the first fluid source 608 to the manifold mixer 616. The second fluid source 610 is coupled to the manifold mixer 616 by second fluid channel 632. The second fluid channel 632 carries the second fluid from the second fluid source 610 to the manifold mixer 616.

In one embodiment, the manifold mixer 616 is coupled to the fluid distributor 618 by a third fluid line 634. The third fluid line 634 carries fluid from the manifold mixer 616 to the fluid distributor 618. The third fluid line 634 may carry the first fluid, the second fluid, a mixture of the first and second fluids, or other fluids, as will be described in more detail below.

The first and second fluid sources 608, 610 can include fluid tanks. The fluid tanks can store the first and second fluids. The fluid tanks can selectively output the first and second fluids.

In one embodiment, the semiconductor process system 600 includes a first purge source 612 and the second purge source 614. The first purge source is coupled to the first fluid line 630 by first purge line 636. The second purge source is coupled to the fluid line 632 by second purge line 638. In practice, the first and second purge sources may be a single purge source.

In one embodiment, the first and second purge sources 612, 614 supply a purging gas into the interior volume 603 of the process chamber 602. The purge fluid is a fluid selected to purge or carry the first fluid, the second fluid, byproducts of the first or second fluid, or other fluids from the interior volume 603 of the process chamber 602. The purge fluid is selected to not interact with the substrate 604, the thin-film layer on the substrate 604, the first and second fluids, and byproducts of this first or second fluid. Accordingly, the purge fluid may be an inert gas including, but not limited to, Ar or $N_2$.

While FIG. 6A illustrates a first fluid source 608 and a second fluid source 610, in practice the semiconductor process system 600 can include other numbers of fluid sources. For example, the semiconductor process system 600 may include only a single fluid source or more than two fluid sources. Accordingly, the semiconductor process system 600 can include a different number than two fluid sources without departing from the scope of the present disclosure.

Figure 6B:
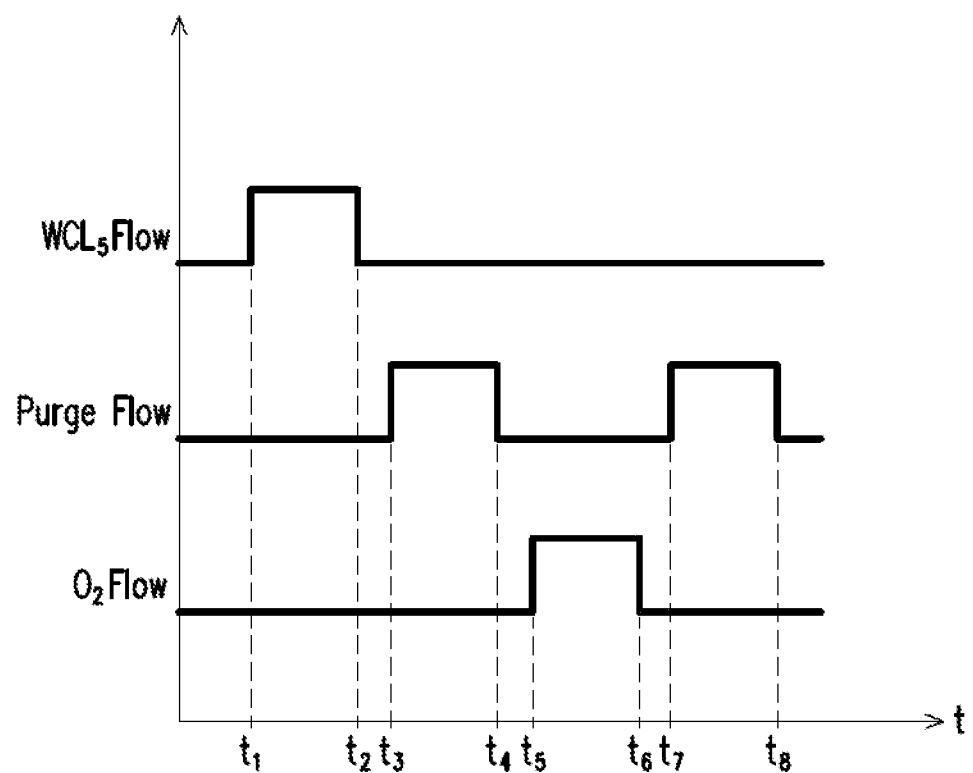
FIG. 6B is a graph illustrating fluid flow during a cycle of an atomic layer etching process.

FIG. 6B is a graph illustrating a cycle of an ALE process, according to one embodiment. The graph of FIG. 6B can correspond to an ALE process performed by the semiconductor process system 600 of FIG. 6A and can be utilized to perform processes and generate structures shown and described in relation FIGS. 1A-5B. At time T1 the first etching fluid begins to flow. In the example of FIG. 6B, the first etching fluid is $WCl_5$. The first etching fluid flows from the fluid source 608 into the interior volume 603. In the interior volume 603, the first etching fluid reacts with the top expose layer of the titanium nitride layer 124. At time T2, the first etching fluid $WCl_5$ stops flowing. In one example, the time elapsed between T1 and T2 between 1 s and 10 s.

At time T3, the purge gas begins to flow. The purge gas flows from one or both of the purge sources 612 and 624. In one example, the purge gas is one of argon, $N_2$, or another inert gas that can purge the first etching fluid $WCl_5$ without reacting with the titanium nitride layer 124. At time T4, the purge gas stops flowing. In one example, the time elapsed between T3 and T4 is between 6 s and 15 s.

At time T5, the second etching fluid flows into the interior volume 603. The second etching fluid flows from the fluid source 610 into the interior volume 603. In one example, the second etching fluid is $O_2$. The $O_2$ reacts with the top atomic or molecular layer of the titanium nitride layer 124 and completes the etching of the top atomic or molecular layer of the titanium nitride layer 124. At time T6, the second etching fluid stops flowing. In one example, the elapsed time between T5 and T6 is between 1 s and 10 s.

At time T7, the purge gas flows again and purges the interior volume 603 of the second etching fluid. At time T8 the purge gas stops flowing. The time between T1 and T8 corresponds to a single ALE cycle.

In practice, an ALE process may include between 5 and 50 cycles, depending on the initial thickness of the titanium nitride layer and the desired final thickness of the titanium nitride layer. Each cycle removes an atomic or molecular layer of the titanium nitride layer 124. Other materials, processes, and elapsed times can be utilized without departing from the scope of the present disclosure.

Figure 7:
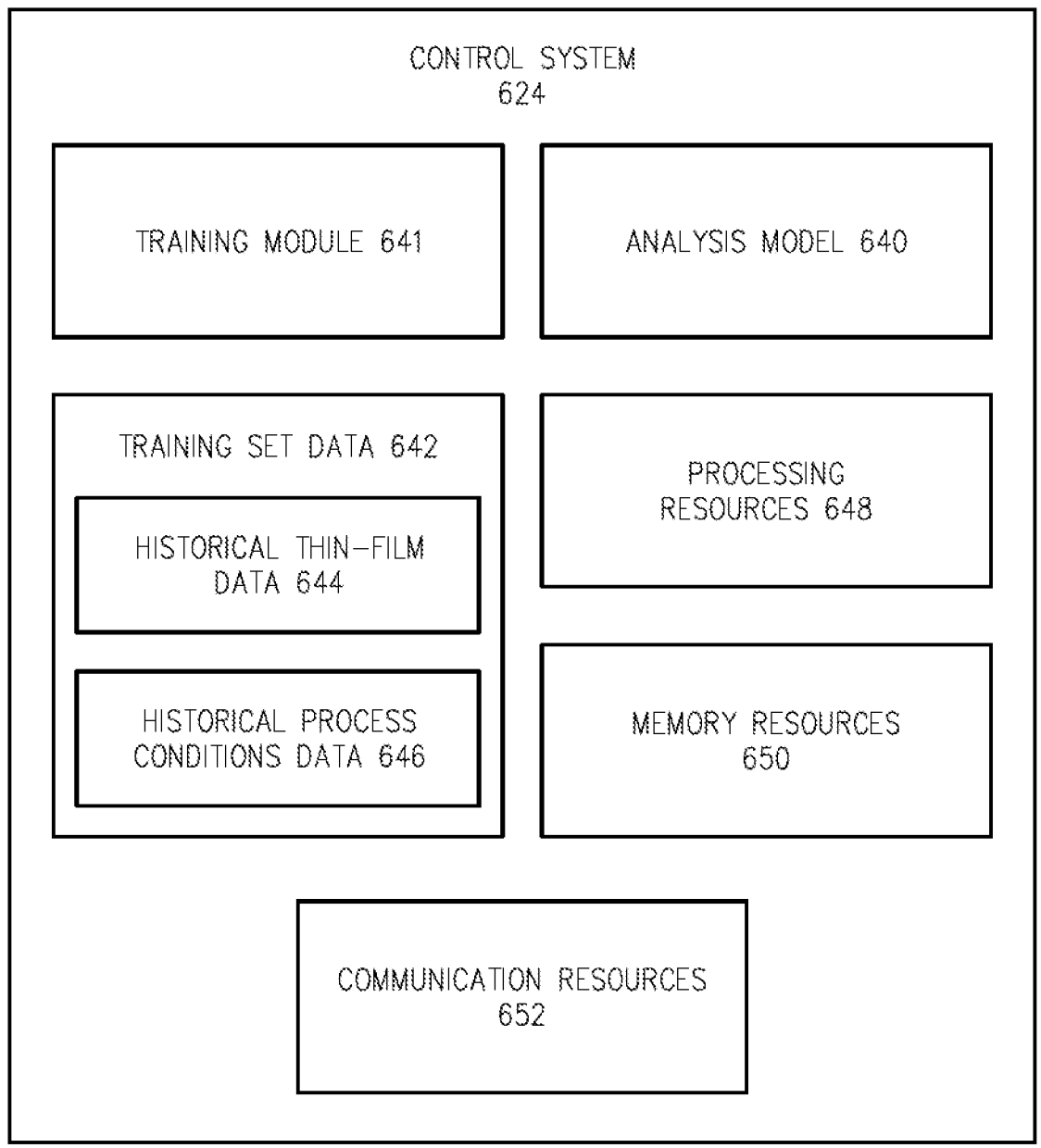
FIG. 7 is a block diagram of a control system of a semiconductor process system.

FIG. 7 is a block diagram of the control system 624, according to one embodiment. The control system 624 of FIG. 7 is configured to control operation of an ALE system 600, according to one embodiment. The control system 624 can be utilized in conjunction with the processes, structures, and systems described in relation to FIGS. 1A-6B. The control system 624 utilizes machine learning to adjust parameters of the ALE system 600. The control system 624 can adjust parameters of the ALE system 600 between ALE runs or even between ALE cycles in order to ensure that a thin-film layer formed by the ALE process falls within selected specifications.

In one embodiment, the control system 624 includes an analysis model 640 and a training module 641. The training module trains the analysis model 640 with a machine learning process. The machine learning process trains the analysis model 640 to select parameters for an ALE process that will result in a thin film having selected characteristics. Although the training module 641 is shown as being separate from the analysis model 640, in practice, the training module 641 may be part of the analysis model 640.

The control system 624 includes, or stores, training set data 642. The training set data 642 includes historical thin-film data 644 and historical process conditions data 646. The historical thin-film data 644 includes data related to thin films resulting from ALE processes. The historical process conditions data 646 includes data related to process conditions during the ALE processes that generated the thin films. As will be set forth in more detail below, the training module 641 utilizes the historical thin-film data 644 and the historical process conditions data 646 to train the analysis model 640 with a machine learning process.

In one embodiment, the historical thin-film data 644 includes data related to the remaining thickness of previously etched thin films. For example, during operation of a semiconductor fabrication facility, thousands or millions of semiconductor wafers may be processed over the course of several months or years. Each of the semiconductor wafers may include thin films etched by ALE processes. After each ALE process, the thicknesses of the thin films are measured as part of a quality control process. The historical thin-film data 644 includes the thicknesses of each of the thin films etched by ALE processes. Accordingly, the historical thin-film data 644 can include thickness data for a large number of thin films etched by ALE processes.

In one embodiment, the historical thin-film data 644 may also include data related to the thickness of thin films at intermediate stages of the thin-film etching processes. For example, an ALE process may include a large number of etching cycles during which individual layers of the thin film are etched. The historical thin-film data 644 can include thickness data for thin films after individual etching cycles or groups of etching cycles. Thus, the historical thin-film data 644 not only includes data related to the total thickness of a thin film after completion of an ALE process, but may also include data related to the thickness of the thin film at various stages of the ALE process.

In one embodiment, the historical thin-film data 644 includes data related to the composition of the thin films etched by ALE processes. After a thin film is etched, measurements can be made to determine the elemental or molecular composition of the thin films. Successful etching of the thin films results in a thin film that includes particular remaining thicknesses. Unsuccessful etching processes may result in a thin film that does not include the desired thickness or composition. The historical thin-film data 644 can include data from measurements indicating the elements or compounds that make up the various thin films.

In one embodiment, the historical process conditions 646 include various process conditions or parameters during ALE processes that etch the thin films associated with the historical thin-film data 644. Accordingly, for each thin film having data in the historical thin-film data 644, the historical process conditions data 646 can include the process conditions or parameters that were present during etching of the thin film. For example, the historical process conditions data 646 can include data related to the pressure, temperature, and fluid flow rates within the process chamber during ALE processes.

The historical process conditions data 646 can include data related to remaining amounts of precursor material in the fluid sources during ALE processes. The historical process conditions data 646 can include data related to the age of the process chamber 602, the number of etching processes that have been performed in the process chamber 602, a number of etching processes that have been performed in the process chamber 602 since the most recent cleaning cycle of the process chamber 602, or other data related to the process chamber 602. The historical process conditions data 646 can include data related to compounds or fluids introduced into the process chamber 602 during the etching process. The data related to the compounds can include types of compounds, phases of compounds (solid, gas, or liquid), mixtures of compounds, or other aspects related to compounds or fluids introduced into the process chamber 602. The historical process conditions data 646 can include data related to the humidity within the process chamber 602 during ALE processes. The historical process conditions data 646 can include data related to light absorption, light adsorption, and light reflection related to the process chamber 602. The historical process conditions data 626 can include data related to the length of pipes, tubes, or conduits that carry compounds or fluids into the process chamber 602 during ALE processes. The historical process conditions data 646 can include data related to the condition of carrier gases that carry compounds or fluids into the process chamber 602 during ALE processes.

In one embodiment, historical process conditions data 646 can include process conditions for each of a plurality of individual cycles of a single ALE process. Accordingly, the historical process conditions data 646 can include process conditions data for a very large number of ALE cycles.

In one embodiment, the training set data 642 links the historical thin-film data 644 with the historical process conditions data 646. In other words, the thin-film thickness, material composition, or crystal structure associated with a thin film in the historical thin-film data 644 is linked to the process conditions data associated with that etching process. As will be set forth in more detail below, the labeled training set data can be utilized in a machine learning process to train the analysis model 640 to predict semiconductor process conditions that will result in properly formed thin films.

In one embodiment, the control system 624 includes processing resources 648, memory resources 650, and communication resources 652. The processing resources 648 can include one or more controllers or processors. The processing resources 648 are configured to execute software instructions, process data, make thin-film etching control decisions, perform signal processing, read data from memory, write data to memory, and to perform other processing operations. The processing resources 648 can include physical processing resources 648 located at a site or facility of the semiconductor process system 600. The processing resources can include virtual processing resources 648 remote from the site or a facility at which the semiconductor process system 600 is located. The processing resources 648 can include cloud-based processing resources including processors and servers accessed via one or more cloud computing platforms.

In one embodiment, the memory resources 650 can include one or more computer readable memories. The memory resources 650 are configured to store software instructions associated with the function of the control system and its components, including, but not limited to, the analysis model 640. The memory resources 650 can store data associated with the function of the control system 624 and its components. The data can include the training set data 642, current process conditions data, and any other data associated with the operation of the control system 624 or any of its components. The memory resources 650 can include physical memory resources located at the site or facility of the semiconductor process system 600. The memory resources can include virtual memory resources located remotely from site or facility of the semiconductor process system 600. The memory resources 650 can include cloud-based memory resources accessed via one or more cloud computing platforms.

In one embodiment, the communication resources can include resources that enable the control system 624 to communicate with equipment associated with the semiconductor process system 600. For example, the communication resources 652 can include wired and wireless communication resources that enable the control system 624 to receive the sensor data associated with the semiconductor process system 600 and to control equipment of the semiconductor process system 600. The communication resources 652 can enable the control system 624 to control the flow of fluids or other material from the fluid sources 608 and 610 and from the purge sources 612 and 614. The communication resources 652 can enable the control system 624 to control heaters, voltage sources, valves, exhaust channels, wafer transfer equipment, and any other equipment associated with the semiconductor process system 600. The communication resources 652 can enable the control system 624 to communicate with remote systems. The communication resources 652 can include, or can facilitate communication via, one or more networks such as wire networks, wireless networks, the Internet, or an intranet. The communication resources 652 can enable components of the control system 624 to communicate with each other.

In one embodiment, the analysis model 640 is implemented via the processing resources 648, the memory resources 650, and the communication resources 652. The control system 624 can be a dispersed control system with components and resources and locations remote from each other and from the semiconductor process system 600.

Figure 8A:
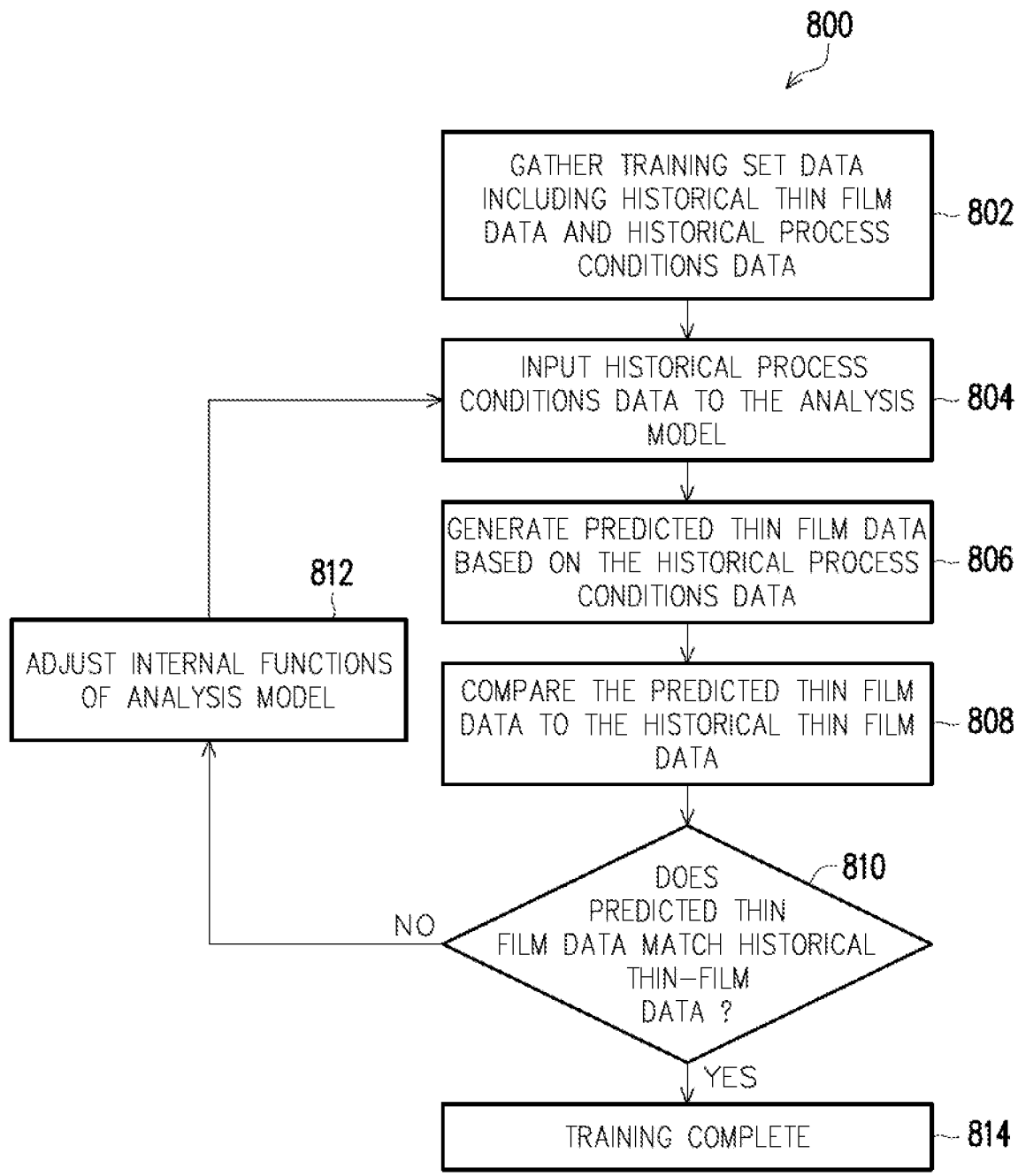
FIG. 8A is flow diagram of a process for training an analysis model of a control system, according to one embodiment.

FIG. 8A is a flow diagram of a process 800 for training an analysis model to identify process conditions that will result in proper etching of a thin film, according to one embodiment. One example of an analysis model is the analysis model 640 of FIG. 7. The various steps of the process 800 can utilize components, processes, and techniques described in relation to FIGS. 1A-7. Accordingly, FIG. 8A is described with reference to FIGS. 1A-7.

At 802, the process 800 gathers training set data including historical thin-film data and historical process conditions data. This can be accomplished by using a data mining system or process. The data mining system or process can gather training set data by accessing one or more databases associated with the semiconductor process system 600 and collecting and organizing various types of data contained in the one or more databases. The data mining system or process, or another system or process, can process and format the collected data in order to generate a training set data. The training set data 642 can include historical thin-film data 644 and historical process conditions data 646 as described in relation to FIG. 7.

At 804, the process 800 inputs historical process conditions data to the analysis model. In one example, this can include inputting historical process conditions data 646 into the analysis model 640 with the training module 641 as described in relation to FIG. 7. The historical process conditions data can be provided in consecutive discrete sets to the analysis model 640. Each district set can correspond to a single thin-film etching process or a portion of a single thin-film etching process. The historical process conditions data can be provided as vectors to the analysis model 640. Each set can include one or more vectors formatted for reception processing by the analysis model 640. The historical process conditions data can be provided to the analysis model 640 in other formats without departing from the scope of the present disclosure.

At 806, the process 800 generates predicted thin-film data based on historical process conditions data. In particular, the analysis model 640 generates, for each set of historical thin-film conditions data 646, predicted thin-film data. The predicted thin-film data corresponds to a prediction of characteristics, such as the remaining thickness, of a thin film that would result from that particular set of process conditions. The predicted thin-film data can include thickness, uniformity, composition, crystal structure, or other aspects of a remaining thin film.

At 808, the predicted thin-film data is compared to the historical thin-film data 644. In particular, the predicted thin-film data for each set of historical process conditions data is compared to the historical thin-film data 644 associated with that set of historical process conditions data. The comparison can result in an error function indicating how closely the predicted thin-film data matches the historical thin-film data 644. This comparison is performed for each set of predicted thin-film data. In one embodiment, this process can include generating an aggregated error function or indication indicating how the totality of the predicted thin-film data compares to the historical thin-film data 644. These comparisons can be performed by the training module 641 or by the analysis model 640. The comparisons can include other types of functions or data than those described above without departing from the scope of the present disclosure.

At 810, the process 800 determines whether the predicted thin-film data matches the historical thin-film data based on the comparisons generated at step 808. For example, the process determines whether the predicted remaining thickness matches the actual remaining thickness after a historical etching process. In one example, if the aggregate error function is less than an error tolerance, then the process 800 determines that the thin-film data does not match the historical thin-film data. In one example, if the aggregate error function is greater than an error tolerance, then the process 800 determines that the thin-film data does match the historical thin-film data. In one example, the error tolerance can include a tolerance between 0.1 and 0. In other words, if the aggregate percentage error is less than 0.1, or 60%, then the process 800 considers that the predicted thin-film data matches the historical thin-film data. If the aggregate percentage error is greater than 0.1 or 60%, then the process 800 considers that the predicted thin-film data does not match the historical thin-film data. Other tolerance ranges can be utilized without departing from the scope of the present disclosure. Error scores can be calculated in a variety of ways without departing from the scope of the present disclosure. The training module 641 or the analysis model 640 can make the determinations associated with process step 810.

In one embodiment, if the predicted thin-film data does not match the historical thin-film data 644 at step 810, then the process proceeds to step 812. At step 812, the process 800 adjusts the internal functions associated with the analysis model 640. In one example, the training module 641 adjusts the internal functions associated with the analysis model 640. From step 812, the process returns to step 804. At step 804, the historical process conditions data is again provided to the analysis model 640. Because the internal functions of the analysis model 640 have been adjusted, the analysis model 640 will generate different predicted thin-film data that in the previous cycle. The process proceeds to steps 806, 808 and 810 and the aggregate error is calculated. If the predicted thin-film data does not match the historical thin-film data, then the process returns to step 812 and the internal functions of the analysis model 640 are adjusted again. This process proceeds in iterations until the analysis model 640 generates predicted thin-film data that matches the historical thin-film data 644.

In one embodiment, if the predicted thin-film data matches the historical thin-film data then process step 810, in the process 800, proceeds to 814. At step 814 training is complete. The analysis model 640 is now ready to be utilized to identify process conditions and can be utilized in thin-film etching processes performed by the semiconductor process system 600. The process 800 can include other steps or arrangements of steps than shown and described herein without departing from the scope of the present disclosure.

Figure 8B:
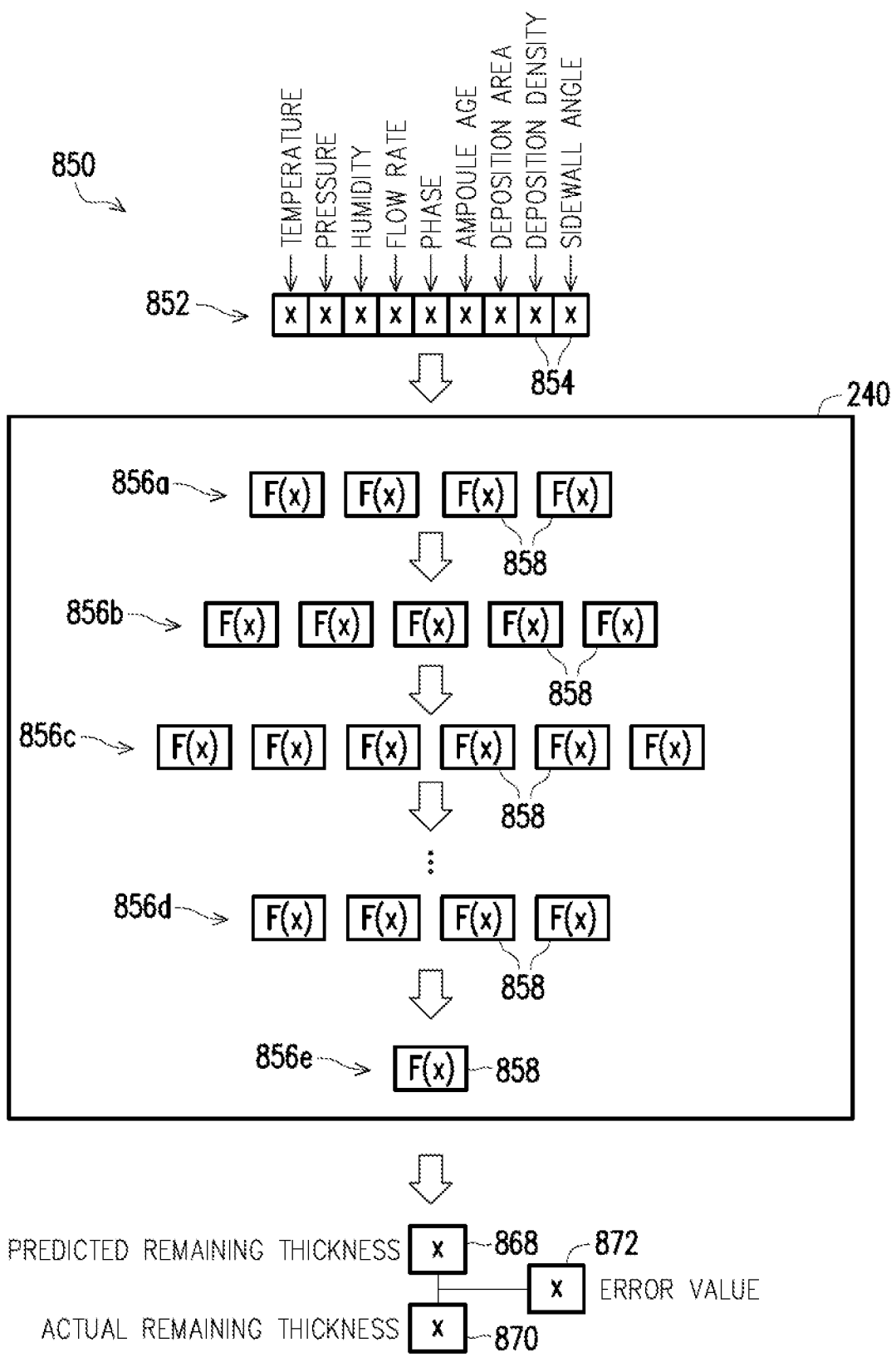
FIG. 8B is a block diagram of an analysis model, according to one embodiment.

FIG. 8B is a block diagram illustrating operational aspects and training aspects of analysis model 640, according to one embodiment. The analysis model 640 can correspond to the analysis model described in relation to FIGS. 6 and 7. The analysis model 640 can be utilized in conjunction with the processes, structures, and systems described in relation to FIGS. 1A-8A. As described previously, the training set data 642 includes data related to a plurality of previously performed thin-film etching processes. Each previously performed thin-film etching process took place with particular process conditions and resulted in a thin-film having a particular characteristics. The process conditions for each previously performed thin-film etching process are formatted into a respective process conditions vector 852. The process conditions vector includes a plurality of data fields 854. Each data field 854 corresponds to a particular process condition.

The example of FIG. 8B illustrates a single process conditions vector 852 that will be passed to the analysis model 640 during the training process. In the example of FIG. 8B, the process conditions vector 852 includes nine data fields 854. A first data field 854 corresponds to the temperature during the previously performed thin-film etching process. A second data field 856 corresponds to the pressure during the previously performed thin-film etching process. A third data field 854 corresponds to the humidity during the previously performed thin-film etching process. The fourth data field 854 corresponds to the flow rate of etching materials during the previously performed thin-film etching process. The fifth data field 854 corresponds to the phase (liquid, solid, or gas) of etching materials during the previously performed thin-film etching process. The sixth data field 854 corresponds to the age of the ampoule used in the previously performed thin-film etching process. The seventh data field 854 corresponds to a size of an etching area on a wafer during the previously performed thin-film etching process. The eighth data field 854 corresponds to the density of surface features of the wafer utilized during the previously performed thin-film etching process. The ninth data field corresponds to the angle of sidewalls of surface features during the previously performed thin-film etching process. In practice, each process conditions vector 852 can include more or fewer data fields than are shown in FIG. 8B without departing from the scope of the present disclosure. Each process conditions vector 852 can include different types of process conditions without departing from the scope of the present disclosure. The particular process conditions illustrated in FIG. 8B are given only by way of example. Each process condition is represented by a numerical value in the corresponding data field 854. For condition types that are not naturally represented in numbers, such as material phase, a number can be assigned to each possible phase.

The analysis model 640 includes a plurality of neural layers 856*a-e*. Each neural layer includes a plurality of nodes 858. Each node 858 can also be called a neuron. Each node 858 from the first neural layer 856*a* receives the data values for each data field from the process conditions vector 852. Accordingly, in the example of FIG. 8B, each node 858 from the first neural layer 856*a* receives nine data values because the process conditions vector 852 has nine data fields. Each neuron 858 includes a respective internal mathematical function labeled F(x) in FIG. 8B. Each node 858 of the first neural layer 856*a* generates a scalar value by applying the internal mathematical function F(x) to the data values from the data fields 854 of the process conditions vector 852. Further details regarding the internal mathematical functions F(x) are provided below.

Each node 858 of the second neural layer 856*b* receives the scalar values generated by each node 858 of the first neural layer 856*a*. Accordingly, in the example of FIG. 8B each node of the second neural layer 856*b* receives four scalar values because there are four nodes 858 in the first neural layer 856*a*. Each node 858 of the second neural layer 856*b* generates a scalar value by applying the respective internal mathematical function F(x) to the scalar values from the first neural layer 856*a*.

Each node 858 of the third neural layer 856*c* receives the scalar values generated by each node 858 of the second neural layer 856*b*. Accordingly, in the example of FIG. 8B each node of the third neural layer 856*c* receives five scalar values because there are five nodes 858 in the second neural layer 856*b*. Each node 858 of the third neural layer 856*c* generates a scalar value by applying the respective internal mathematical function F(x) to the scalar values from the nodes 858 of the second neural layer 856*b*.

Each node 858 of the neural layer 856*d* receives the scalar values generated by each node 858 of the previous neural layer (not shown). Each node 858 of the neural layer 856*d* generates a scalar value by applying the respective internal mathematical function F(x) to the scalar values from the nodes 858 of the second neural layer 856*b*.

The final neural layer includes only a single node 858. The final neural layer receives the scalar values generated by each node 858 of the previous neural layer 856*d*. The node 858 of the final neural layer 856*e* generates a data value 868 by applying a mathematical function F(x) to the scalar values received from the nodes 858 of the neural layer 856*d*.

In the example of FIG. 8B, the data value 868 corresponds to the predicted remaining thickness of a thin film generated by process conditions data corresponding to values included in the process conditions vector 852. In other embodiments, the final neural layer 856*e* may generate multiple data values each corresponding to a particular thin-film characteristic such as thin-film crystal orientation, thin-film uniformity, or other characteristics of a thin film. The final neural layer 856*e* will include a respective node 858 for each output data value to be generated. In the case of a predicted thin film thickness, engineers can provide constraints that specify that the predicted thin film thickness 868 must fall within a selected range, such as between 0 nm and 50 nm, in one example. The analysis model 640 will adjust internal functions F(x) to ensure that the data value 868 corresponding to the predicted thin film thickness will fall within the specified range.

During the machine learning process, the analysis model compares the predicted remaining thickness in the data value 868 to the actual remaining thickness of the thin-film as indicated by the data value 870. As set forth previously, the training set data 642 includes, for each set of historical process conditions data, thin-film characteristics data indicating the characteristics of the thin-film that resulted from the historical thin-film etching process. Accordingly, the data field 870 includes the actual remaining thickness of the thin-film that resulted from the etching process reflected in the process conditions vector 852. The analysis model 640 compares the predicted remaining thickness from the data value 868 to the actual remaining thickness from the data value 870. The analysis model 640 generates an error value 872 indicating the error or difference between the predicted remaining thickness from the data value 868 and the actual remaining thickness from the data value 870. The error value 872 is utilized to train the analysis model 640.

The training of the analysis model 640 can be more fully understood by discussing the internal mathematical functions F(x). While all of the nodes 858 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 858 in the previous neural layer, or, in the case of the first neural layer 856*a*, each value $x_1$-$x_n$ corresponds to a respective data value from the data fields 854 of the process conditions vector 852. Accordingly, n for a given node is equal to the number of nodes in the previous neural layer. The values $w_1$-$w_n$ are scalar weighting values associated with a corresponding node from the previous layer. The analysis model 640 selects the values of the weighting values $w_1$-$w_n$. The constant b is a scalar biasing value and may also be multiplied by a weighting value. The value generated by a node 858 is based on the weighting values $w_1$-$w_n$. Accordingly, each node 858 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 872 has been calculated, the analysis model 640 adjusts the weighting values $w_1$-$w_n$ for the various nodes 858 of the various neural layers 856*a*-356*e*. After the analysis model 640 adjusts the weighting values $w_1$-$w_n$, the analysis model 640 again provides the process conditions vector 852 to the input neural layer 856*a*. Because the weighting values are different for the various nodes 858 of the analysis model 640, the predicted remaining thickness 868 will be different than in the previous iteration. The analysis model 640 again generates an error value 872 by comparing the actual remaining thickness 870 to the predicted remaining thickness 868.

The analysis model 640 again adjusts the weighting values $w_1$-$w_n$ associated with the various nodes 858. The analysis model 640 again processes the process conditions vector 852 and generates a predicted remaining thickness 868 and associated error value 872. The training process includes adjusting the weighting values $w_1$-$w_n$ in iterations until the error value 872 is minimized.

FIG. 8B illustrates a single process conditions vector 852 being passed to the analysis model 640. In practice, the training process includes passing a large number of process conditions vectors 852 through the analysis model 640, generating a predicted remaining thickness 868 for each process conditions vector 852, and generating associated error value 872 for each predicted remaining thickness. The training process can also include generating an aggregated error value indicating the average error for all the predicted remaining thicknesses for a batch of process conditions vectors 852. The analysis model 640 adjusts the weighting values $w_1$-$w_n$ after processing each batch of process conditions vectors 852. The training process continues until the average error across all process conditions vectors 852 is less than a selected threshold tolerance. When the average error is less than the selected threshold tolerance, the analysis model 640 training is complete and the analysis model is trained to accurately predict the thickness of thin films based on the process conditions. The analysis model 640 can then be used to predict thin-film thicknesses and to select process conditions that will result in a desired thin-film thickness. During use of the trained model 640, a process conditions vector, representing current process condition for a current thin film etching process to be performed, and having the same format at the process conditions vector 852, is provided to the trained analysis model 640. The trained analysis model 640 can then predict the thickness of a thin film that will result from those process conditions.

A particular example of a neural network based analysis model 640 has been described in relation to FIG. 8B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 9:
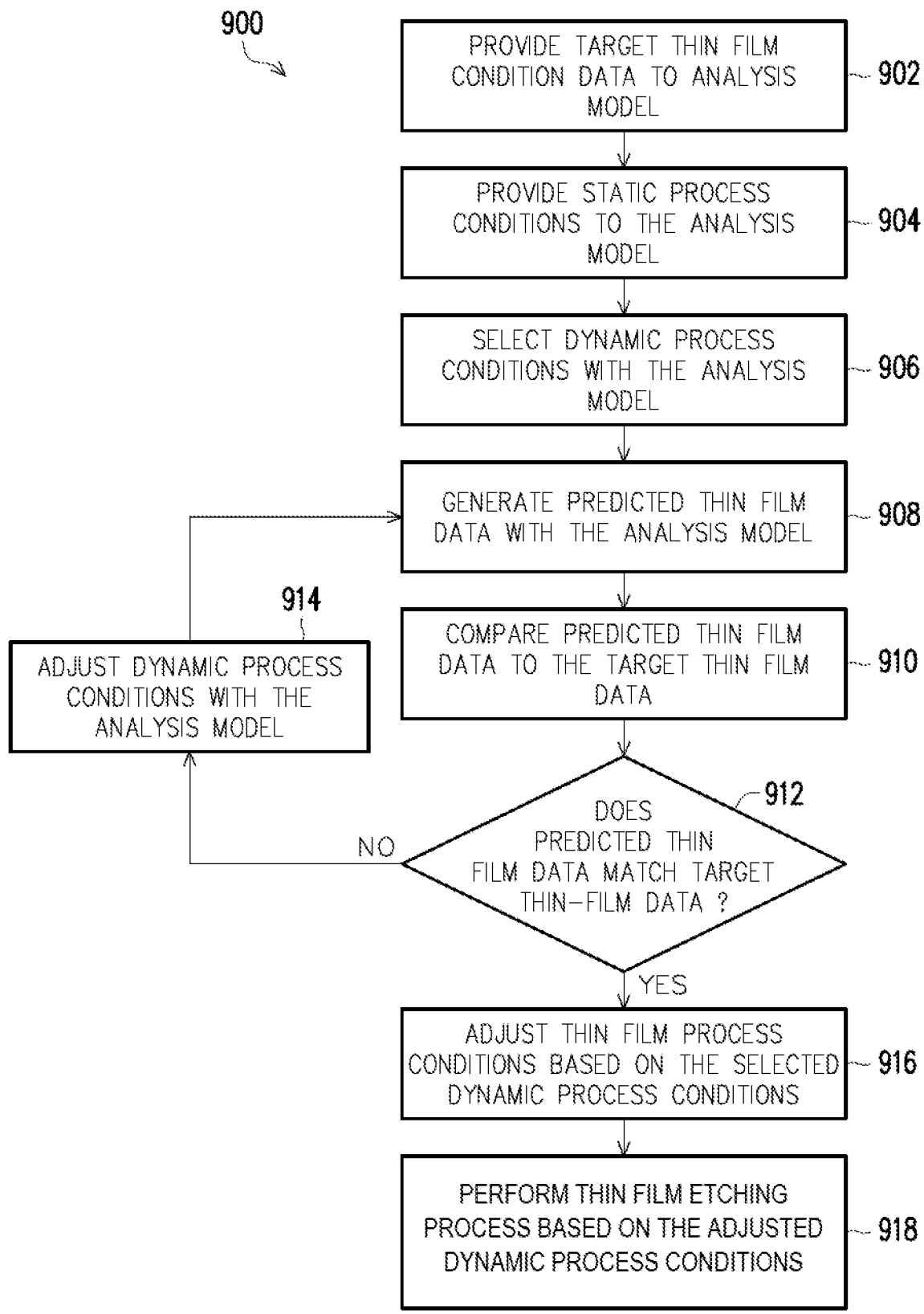
FIG. 9 is a flow diagram of a process for performing a thin-film deposition process in conjunction with an analysis model, according to one embodiment.

FIG. 9 is a flow diagram of a process 900 for dynamically selecting process conditions for thin-film etching process and for performing a thin-film etching process, according to one embodiment. The various steps of the process 900 can utilize components, processes, and techniques described in relation to FIGS. 1A-8B. Accordingly, FIG. 9 is described with reference to FIGS. 6-3B.

At 902, the process 900 provides target thin-film conditions data to the analysis model 640. The target thin-film conditions data identifies selected characteristics of a thin film to be formed by thin-film etching process. The target thin-film conditions data can include a target remaining thickness, a target composition, target crystal structure, or other characteristics of the thin film. The target thin-film conditions data can include a range of thicknesses. The target condition or characteristics that can be selected are based on thin film characteristic(s) utilized in the training process. In the example of FIG. 8B, the training process focused on thin film thickness.

At 904, the process 900 provides static process conditions to the analysis model 640. The static process conditions include process conditions that will not be adjusted for a next thin-film etching process. The static process conditions can include the target device pattern density indicating the density of patterns on the wafer on which the thin-film etching process will be performed. The static process conditions can include an effective plan area crystal orientation, an effective plan area roughness index, an effective sidewall area of the features on the surface of the semiconductor wafer, an exposed effective sidewall tilt angle, an exposed surface film function group, an exposed sidewall film function group, a rotation or tilt of the semiconductor wafer, process gas parameters (materials, phase of materials, and temperature of materials), a remaining amount of material fluid in the fluid sources 608 and 610, a remaining amount of fluid in the purge sources 612 and 614, a humidity within a process chamber, an age of an ampoule utilized in the etching process, light absorption or reflection within the process chamber, the length of pipes or conduits that will provide fluids to the process chamber, or other conditions. The static process conditions can include conditions other than those described above without departing from the scope of the present disclosure. Furthermore, in some cases, some of the static process conditions listed above may be dynamic process conditions subject to adjustment as will be described in more detail below. In the example of FIG. 8B, dynamic process conditions include temperature, pressure, humidity, and flow rate. Static process conditions include phase, ampoule age, etching area, etching density, and sidewall angle.

At 906, the process 900 selects dynamic process conditions for the analysis model, according to one embodiment. The dynamic process conditions can include any process conditions not designated as static process conditions. For example, the training set data may include a large number of various types of process conditions data in the historical process conditions data 646. Some of these types of process conditions will be defined the static process conditions and some of these types of process conditions will be defined as dynamic process conditions. Accordingly, when the static process conditions are supplied at step 904, the remaining types of process conditions can be defined as dynamic process conditions. The analysis model 640 can initially select initial values for the dynamic process conditions. After the initial values have been selected for the dynamic process conditions, the analysis model has a full set of process conditions to analyze. In one embodiment, the initial values for the dynamic process conditions may be selected based on previously determined starter values, or in accordance with other schemes.

The dynamic process conditions can include the flow rate of fluids or materials from the fluid sources 608 and 610 during the etching process. The dynamic process conditions can include the flow rate of fluids or materials from the purge sources 612 and 614. The dynamic process conditions can include a pressure within the process chamber, a temperature within the process chamber, a humidity within the process chamber, durations of various steps of the etching process, or voltages or electric field generated within the process chamber. The dynamic process conditions can include other types of conditions without departing from the scope of the present disclosure.

At 908, the analysis model 640 generates predicted thin-film data based on the static and dynamic process conditions. The predicted thin-film data includes the same types of thin-film characteristics established in the target thin-film conditions data. In particular, the predicted thin-film data includes the types of predicted thin-film data from the training process described in relation to FIGS. 8A and 8B. For example, the predicted thin-film data can include thin-film thickness, film composition, or other parameters of thin films.

At 910, the process compares the predicted thin-film data to the target thin-film data. In particular, the analysis model 640 compares the predicted thin-film data to the target thin-film data. The comparison indicates how closely the predicted thin-film data matches the target thin-film data. The comparison can indicate whether or not predicted thin-film data falls within tolerances or ranges established by the target thin-film data. For example, if the target thin-film thickness is between 6 nm and 9 nm, then the comparison will indicate whether the predicted thin-film data falls within this range.

At 912, if the predicted thin-film data does not match the target thin-film data, then the process proceeds to 914. At 914, the analysis model 640 adjusts the dynamic process conditions data. From 914 the process returns to 908. At 908, the analysis model 640 again generates predicted thin-film data based on the static process conditions and the adjusted dynamic process conditions. The analysis model then compares the predicted thin-film data to the target thin-film data at 910. At 912, if the predicted thin-film data does not match the target thin-film data, then the process proceeds to 914 and the analysis model 640 again adjusts the dynamic process conditions. This process proceeds until predicted thin-film data is generated that matches the target thin-film data. If the predicted thin-film data matches the target thin-film data 912, then the process proceeds to 916.

At 916, the process 900 adjusts the thin-film process conditions of the semiconductor process system 600 based on the dynamic process conditions that resulted in predicted thin-film data within the target thin-film data. For example, the control system 624 can adjust fluid flow rates, etching step durations, pressure, temperature, humidity, or other factors in accordance with the dynamic process conditions data.

At 918, the semiconductor process system 600 performs a thin-film etching process in accordance with the adjusted dynamic process conditions identified by the analysis model. In one embodiment, the thin-film etching process is an ALE process. However, other thin-film etching processes can be utilized without departing from the scope of the present disclosure. In one embodiment, the semiconductor process system 600 adjusts the process parameters based on the analysis model between individual etching stages in a thin-film etching process. For example, in an ALE process, the thin-film is etched one layer at a time. The analysis model 640 can identify parameters to be utilized for etching of the next layer. Accordingly, the semiconductor process system can adjust etching conditions between the various etching stages.

In one embodiment, an integrated circuit includes a transistor including a terminal. The integrated circuit includes a dielectric layer disposed on the terminal and having a first trench exposing the first terminal and including a sidewall, a first barrier layer disposed on the terminal, and a second layer disposed on the first barrier layer and on the sidewall and having a vertical extent in the trench higher than a vertical extent of the first barrier layer in the trench. The integrated circuit includes a conductive plug positioned in the trench and in contact with the second barrier layer.

In one embodiment, a method includes forming a dielectric layer on a terminal of a transistor, exposing the terminal by forming a trench in the dielectric layer, and forming a first titanium nitride layer in the trench on the terminal of the transistor. The method includes forming a second titanium nitride layer in the trench above the first barrier layer and on a sidewall of the trench and forming a cobalt plug in the trench.

In one embodiment, a method incudes a method includes training an analysis model with a machine learning process to select parameters for an atomic layer etching process and etching a thin film over a transistor. The method includes selecting etching parameters for etching the thin film etching the thin film with the atomic layer process including the selected etching parameters.

Embodiments of the present disclosure provide thin films of reliable thickness and composition. Embodiments of the present disclosure dynamically adjust process parameters to ensure that thin films have desired properties.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a first dielectric layer;
a transistor including a source/drain terminal having a top surface substantially coplanar with a top surface of the first dielectric layer;
a second dielectric layer on the first dielectric layer;
a first trench in the second dielectric layer exposing the source/drain terminal and defining a sidewall of the second dielectric layer;
a silicide layer in contact with the top surface of the source/drain terminal in the trench;
a metal layer on the silicide in the trench and including a substantially planar bottom surface in contact with a top surface of the silicide layer and a substantially planar top surface;
a first barrier layer having a planar bottom surface in contact with the top surface of the metal layer in the trench and substantially planar top surface;
a second barrier layer having a planar bottom surface in contact with the top surface of the first barrier layer, the second barrier layer in contact with the sidewall of the second dielectric layer and having a vertical extent in the trench higher than a vertical extent of the first barrier layer in the trench; and
a conductive plug positioned in the trench and in contact with the second barrier layer.

2. The integrated circuit of claim 1, wherein the first barrier layer is positioned on the sidewall below second barrier layer.

3. The integrated circuit of claim 1, wherein the second barrier layer isolates the first barrier layer from the sidewall.

4. The integrated circuit of claim 1, wherein the first and second barrier layers are titanium nitride.

5. The integrated circuit of claim 4, wherein the conductive plug is cobalt.

6. The integrated circuit of claim 4, wherein the first barrier layer is formed by nitridation of titanium.

7. The integrated circuit of claim 6, wherein the first barrier layer is formed with an atomic layer deposition process.

8. The integrated circuit of claim 1, wherein the terminal is a metal gate of the transistor.

9. The integrated circuit of claim 1, wherein the terminal is a source terminal of the transistor.

10. The integrated circuit of claim 1, wherein the transistor includes a plurality of semiconductor nanosheets.

11. A method, comprising:
forming a first dielectric layer;
forming a transistor including a source/drain terminal having a top surface substantially coplanar with a top surface of the first dielectric layer;
forming a second dielectric layer on the first dielectric layer;
forming a first trench in the second dielectric layer exposing the source/drain terminal and defining a sidewall of the second dielectric layer;
forming a silicide layer in contact with the top surface of the source/drain terminal in the trench;
forming a metal layer on the silicide in the trench and including a substantially planar bottom surface in contact with a top surface of the silicide layer and a substantially planar top surface;
forming a first barrier layer having a planar bottom surface in contact with the top surface of the metal layer in the trench and substantially planar top surface;
forming a second barrier layer having a planar bottom surface in contact with the top surface of the first barrier layer, the second barrier layer in contact with the sidewall of the second dielectric layer and having a vertical extent in the trench higher than a vertical extent of the first barrier layer in the trench; and
forming a conductive plug positioned in the trench and in contact with the second barrier layer.

12. The method of claim 11, wherein the first barrier layer is positioned on the sidewall below second barrier layer.

13. The method of claim 11, wherein the second barrier layer isolates the first barrier layer from the sidewall.

14. The method of claim 11, wherein the first and second barrier layers are titanium nitride.

15. The method of claim 14, wherein the conductive plug is cobalt.

16. The method of claim 14, wherein the first barrier layer is formed by nitridation of titanium.

17. The method of claim 16, wherein the first barrier layer is formed with an atomic layer deposition process.

18. An integrated circuit, comprising:
a transistor including a source/drain terminal;
an interlevel dielectric layer include a trench defining a sidewall of the dielectric layer;
a silicide layer in contact with the top surface of the source/drain terminal in the trench;
a metal layer on the silicide in the trench and including a substantially planar bottom surface in contact with a top surface of the silicide layer and a substantially planar top surface;
a first barrier layer having a planar bottom surface in contact with the top surface of the metal layer in the trench and a stepped profile;
a second barrier layer having a bottom surface in contact with a top surface of the first barrier layer, the second barrier layer having a stepped profile and in contact with the sidewall of the second dielectric layer and having a vertical extent in the trench higher than a vertical extent of the first barrier layer in the trench; and
a cobalt plug positioned in the trench and in contact with the second barrier layer.

19. The integrated circuit of claim 18, wherein the cobalt plug is a source/drain contact of the transistor.

20. The integrated circuit of claim 18, wherein the cobalt plug has a stepped bottom surface and a planar top surface.

* * * * *